US011670539B2

(12) United States Patent
Lee et al.

(10) Patent No.: US 11,670,539 B2
(45) Date of Patent: Jun. 6, 2023

(54) METHOD OF MAKING A SEMICONDUCTOR ARRANGEMENT

(71) Applicant: TAIWAN SEMICONDUCTOR MANUFACTURING COMPANY LIMITED, Hsin-Chu (TW)

(72) Inventors: Ming-Che Lee, Tainan (TW); Sheng-Chau Chen, Tainan (TW); Cheng-Hsien Chou, Tainan (TW); Cheng-Yuan Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 17/181,464

(22) Filed: Feb. 22, 2021

(65) Prior Publication Data

US 2022/0270918 A1    Aug. 25, 2022

(51) Int. Cl.
*H01L 21/762*    (2006.01)
*H01L 21/02*    (2006.01)

(52) U.S. Cl.
CPC .. *H01L 21/76251* (2013.01); *H01L 21/02164* (2013.01); *H01L 21/02252* (2013.01)

(58) Field of Classification Search
CPC ..................................................... H01L 21/187
See application file for complete search history.

(56) References Cited

U.S. PATENT DOCUMENTS

| 2009/0203174 | A1* | 8/2009 | Ichijo | H01L 27/1266 |
| | | | | 438/479 |
| 2013/0207098 | A1* | 8/2013 | Yeh | H01L 21/67092 |
| | | | | 257/43 |
| 2019/0051524 | A1* | 2/2019 | Guo | H01L 21/187 |
| 2020/0212004 | A1* | 7/2020 | Liu | H01L 25/18 |
| 2020/0313643 | A1* | 10/2020 | Hori | H01L 41/313 |

FOREIGN PATENT DOCUMENTS

| CN | 104658927 B | * | 3/2018 |
| TW | 201911365 A | | 3/2019 |

* cited by examiner

*Primary Examiner* — Selim U Ahmed
*Assistant Examiner* — Evan G Clinton
(74) *Attorney, Agent, or Firm* — Cooper Legal Group, LLC

(57) ABSTRACT

A method of making a semiconductor arrangement includes forming a first layer of molecular ions in a first wafer interface region of a first wafer, forming a second layer of molecular ions in a second wafer interface region of a second wafer, forming a first molecular bond connecting the first wafer interface region to the second wafer interface region by applying pressure to at least one of the first wafer or the second wafer in a direction toward the first wafer interface region and the second wafer interface region, and annealing the first wafer and the second wafer to form a second molecular bond connecting the first wafer interface region to the second wafer interface region.

20 Claims, 17 Drawing Sheets

METHOD OF MAKING A SEMICONDUCTOR ARRANGEMENT

BACKGROUND

Semiconductor arrangements are used in a multitude of electronic devices, such as mobile phones, laptops, desktops, tablets, watches, gaming systems, and various other industrial, commercial, and consumer electronics. A semiconductor arrangement may include a wafer having one or more of substrate, doped, undoped, implant, and isolation regions. Many devices include electronic components directly or indirectly coupled to a semiconductor arrangement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
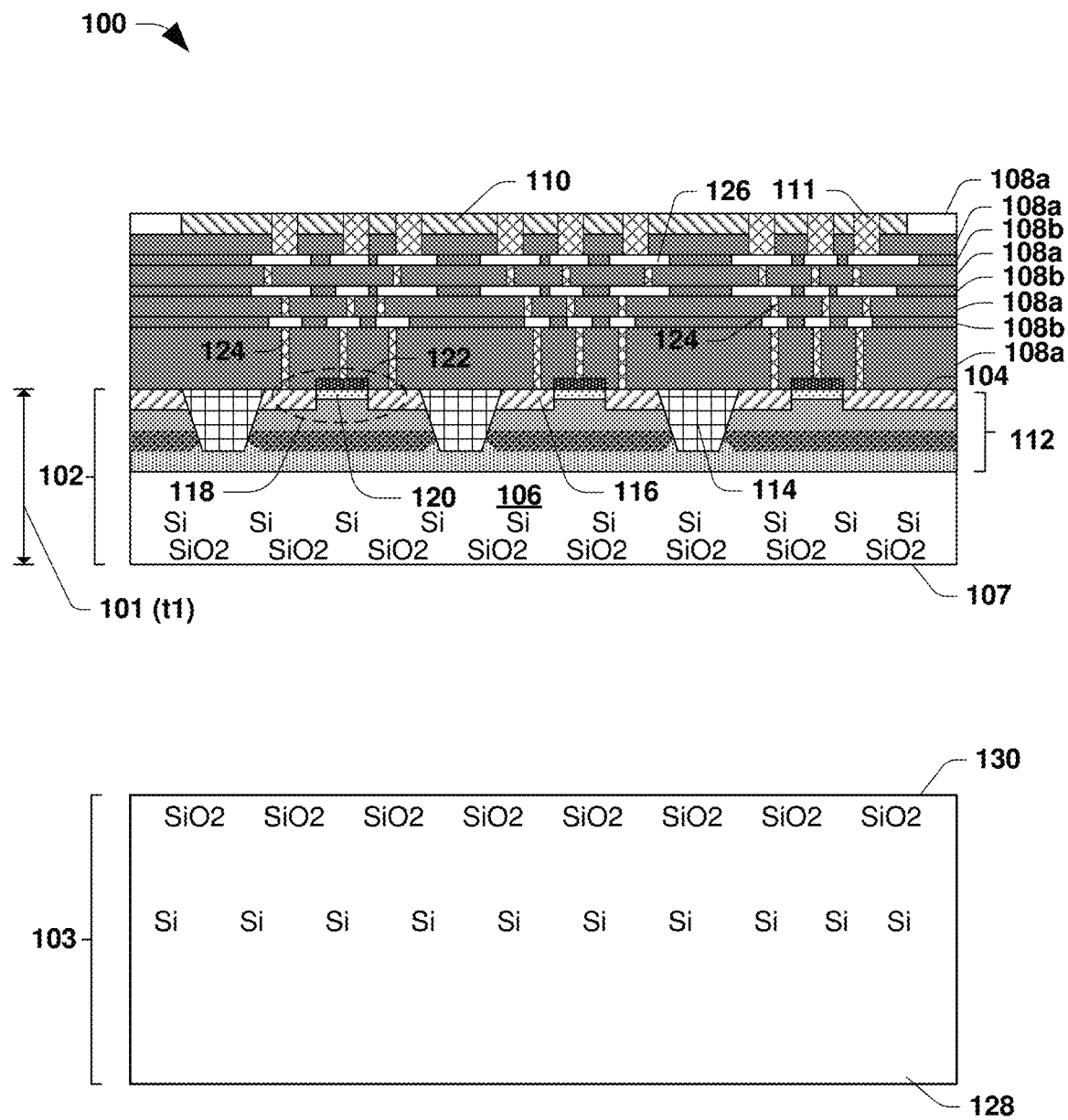
FIGS. 1-18 are illustrations of a semiconductor arrangement at various stages of fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

One or more methods of making a semiconductor arrangement are provided herein. A semiconductor arrangement includes a device wafer having a silicon region, an implant region, and interconnect layers formed over the device wafer. Integrated circuit components are formed in the implant region and are electrically coupled to the interconnect layers. Electronic components are coupled to the upper surface of the device wafer or to the upper surface of the interconnect layers. Warpage of the device wafer, which would otherwise occur, such as due to the weight of the electronic components coupled to the upper surface of the device wafer or to the upper surface of the interconnect layers, is significantly diminished or eliminated by inclusion of a carrier wafer covalently bonded to the bottom surface of the device wafer. The combined thickness of the device wafer and the carrier wafer increases the rigidity or structural integrity of the semiconductor arrangement and diminishes or eliminates warpage of the device wafer.

The carrier wafer is adhered to the bottom surface of the device wafer by aligning the bottom surface of the device wafer to an upper surface of the carrier wafer. The aligned surfaces are placed in physical contact at an interface of the bottom surface of the device wafer and the upper surface of the carrier wafer. A force/pressure is applied to the device wafer and/or the carrier wafer in a direction toward the interface. The applied force/pressure causes molecular bonds (Van de Waals bonds) to form at the interface, thereby bonding the carrier wafer to the device wafer. The molecular bonds are between silicon atoms of the device wafer and silicon dioxide molecules of the carrier wafer. The strength of the bond between the carrier wafer and the device wafer is increased through a subsequent anneal process that forms covalent bonds of silicon of the device wafer, an oxide, and silicon of the carrier wafer at the interface of the bottom surface of the device wafer and the upper surface of the carrier wafer. The covalent bonds form an Si—Ox—Si interface.

Once the carrier wafer is bonded to the device wafer, the thickness of the carrier wafer may be reduced to reduce the weight of the semiconductor arrangement while maintaining the increase in rigidity of the semiconductor arrangement and resistance to warpage of the device wafer.

FIGS. 1-18 are illustrations of a semiconductor arrangement 100 at various stages of fabrication, according to some embodiments.

Turning to FIG. 1, at least some of the semiconductor arrangement 100 is formed in or on a first wafer 102, at times referred to as a device wafer. The thickness of the first wafer 102 is "t1" 101. The first wafer 102 comprises a silicon region 106 comprising silicon (Si). In some embodiments, the first wafer 102 includes an implant region 112. The implant region 112 comprises at least one of a p-type substrate (P-substrate) region, an n-type substrate (N-substrate) region, doped regions or undoped regions. The first wafer 102 has an upper surface 104 over the implant region 112 and a first wafer interface region 107 opposite the upper surface 104. A layer of silicon dioxide (SiO2) is formed in the first wafer interface region 107 by exposing the first wafer interface region 107 to oxygen (O2). Other configurations and/or compositions of the first wafer 102 are within the scope of the present disclosure.

According to some embodiments, at least some of the doped regions of the implant region 112 are formed by at least one of ion implantation, molecular diffusion, or other suitable techniques. A number or an amount of dopants implanted into the implant region 112 is controlled, such as to control a concentration of dopants in the implant region 112. In some embodiments, an energy of dopants implanted into the implant region 112 is controlled, such as to control a depth to which dopants are implanted into the implant region 112. A depth of dopants in the implant region 112 is controlled by increasing or decreasing a voltage used to direct the dopants into the implant region 112. As such, at least one of the silicon region 106 or the implant region 112 comprises at least one of p-type dopants or n-type dopants. In some embodiments, the implant region 112 includes the silicon region 106 or the silicon region 106 includes the implant region 112. Other configurations and/or compositions of the silicon region 106 and the implant region 112 are within the scope of the present disclosure.

According to some embodiments, the first wafer 102 comprises one or more shallow trench isolation (STI) structures 114 formed in the implant region 112. At least some of the one or more STI structures 114 are formed prior to the formation of other components of the implant region 112. In some embodiments, formation of the STI structures 114 comprises etching a trench in the first wafer 102, depositing one or more dielectric materials to fill the trench, and planarizing a top surface of the deposited dielectric material. A dielectric material of the STI structures 114 is at least one of an oxide, nitride, or other suitable materials. Other configurations and/or compositions of the STI structures 114 are within the scope of the present disclosure.

According to some embodiments, the first wafer 102 comprises one or more conductive regions 116. At least some of the one or more conductive regions 116 are at least one of over the first wafer 102 or in the first wafer 102. At least some of the one or more conductive regions 116 are at least one of a source region or a drain region. At least some of the one or more conductive regions 116 comprise dopants implanted into the first wafer 102. Other configurations and/or compositions of the one or more conductive regions 116 are within the scope of the present disclosure.

According to some embodiments, the semiconductor arrangement 100 comprises a transistor 118 comprising a dielectric region 120 and a gate electrode 122. The dielectric region 120 comprises a dielectric material such as at least one of oxide, nitride, or other suitable materials. The gate electrode 122 comprises a conductive material such as at least one of polysilicon, metal, or other suitable materials. Other configurations and/or compositions of the transistor 118 are within the scope of the present disclosure.

According to some embodiments, the semiconductor arrangement 100 comprises one or more first dielectric layers 108a over the upper surface 104 of the first wafer 102. At least some of the one or more first dielectric layers 108a are interlayer dielectric (ILD) layers comprising at least one of tetraethylorthosilicate (TEOS), borophosphosilicate glass (BPSG), fused silica glass (FSG), phosphosilicate glass (PSG), boron doped silicon glass (BSG), or other suitable materials. At least some of the one or more first dielectric layers 108a are formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. Other configurations and/or compositions of the first dielectric layers 108a are within the scope of the present disclosure.

The semiconductor arrangement 100 comprises one or more second dielectric layers 108b over one or more first dielectric layers 108a. At least some of the one or more second dielectric layers 108b comprise at least one of TEOS, BPSG, FSG, PSG, BSG, or other suitable materials. At least some of the one or more second dielectric layers 108b are formed by at least one of PVD, sputtering, CVD, LPCVD, ALCVD, UHVCVD, RPCVD, ALD, MBE, LPE, spin on, growth, or other suitable techniques. At least some of the one or more second dielectric layers 108b have a same material composition as at least some of the one or more first dielectric layers 108a. Other configurations and/or compositions of the second dielectric layers 108b are within the scope of the present disclosure.

The semiconductor arrangement 100 comprises one or more vertical interconnect accesses (VIAs) 124 formed through at least some of the one or more first dielectric layers 108a and one or more metal layers 126 formed through at least some of the one or more second dielectric layers 108b. According to some embodiments, at least some of the one or more metal layers 126 are in electrical communication with at least some of the one or more VIAs 124, and at least some of the one or more VIAs 124 are in electrical communication with one or more conductive regions 116 such that a metal layer of the one or more metal layers 126 and a VIA of the one or more VIAs 124 provide an electrical pathway through the first dielectric layers 108a and second dielectric layers 108b to a conductive region of the one or more conductive regions 116. Other configurations and/or compositions of the one or more VIAs 124 and/or the one or more metal layers 126 are within the scope of the present disclosure.

In some embodiments, the semiconductor arrangement 100 comprises one or more interface VIAs 111 formed through at least some of the first dielectric layers 108a and/or at least some of the second dielectric layers 108b. According to some embodiments, the circumference of one or more interface VIAs 111 is greater than the circumference of one or more VIAs 124. Compared to the one or more VIAs 124, at least some of the one or more interface VIAs 111 are low-resistance VIAs configured to electrically couple to components formed over the one or more interface VIAs 111. Other configurations and/or compositions of the interface VIAs 111 are within the scope of the present disclosure.

In some embodiments, at least one of at least some of the one or more metal layers 126, at least some of the one or more VIAs 124, or at least some of the one or more interface VIAs 111 are formed by at least one of lithography, etching, PVD, sputtering, CVD, LPCVD, ALCVD, UHVCVD, RPCVD, ALD, MBE, LPE, spin on, growth, a dual damascene process, or other suitable techniques.

In some embodiments, the semiconductor arrangement 100 comprises a passivation layer 110 formed over at least one of the first dielectric layers 108a or the second dielectric layers 108b. The passivation layer 110 protects at least some of the first dielectric layers 108a, at least some of the second dielectric layers 108b, at least some of the one or more interface VIAs 111, at least some of the one or more metal layers 126, and/or at least some of the one or more VIAs 124 from undergoing corrosion or other alterations during subsequent formation processes of the semiconductor arrangement 100. In some embodiments, the passivation layer 110 includes at least one of aluminum nitride (AlN), aluminum oxide (Al2O3), SiO2, silicon nitride (Si3N4), a chemically inert, corrosion-resistant dielectric material, or an organic compound having at least one of an N—, P—or S— group molecular structure, or other suitable materials. Other configurations and/or compositions of the passivation layer 110 are within the scope of the present disclosure.

In some embodiments, the passivation layer 110 is formed by at least one of PVD, sputtering, CVD, LPCVD, ALCVD, UHVCVD, RPCVD, ALD, MBE, LPE, spin on, growth, passivation, or other suitable techniques. A passivation process includes at least one of oxidation of a surface of an underlying material or complexing of the surface of the underlying material with an organic compound. The passivation layer 110 includes a layer or layers of film covering an underlying material, such as a material of the one or more of the first dielectric layers 108a and/or the second dielectric layers 108b. A chemically-stable material is used to produce the layer or layers of film. The layer or layers of film at least one of inhibits dissolution or reduces at least one of electrical or chemical reactivity with regard to the underlying material at least one of during or after subsequent processes or treatments of the semiconductor arrangement 100. Other processes of forming the passivation layer 110 are within the scope of the present disclosure.

The passivation layer 110 at least one of inhibits diffusion of at least one of charges, atoms, or ions into the underlying material, mitigates oxidation of the underlying material, protects the underlying material from environmental conditions, or acts as a diffusion barrier with regard to the underlying material. Other purposes or functions of the passivation layer 110 are within the scope of the present disclosure.

The semiconductor arrangement 100 includes a second wafer 103, at times referred to as a carrier wafer. The second wafer 103 comprises Si or other suitable materials. The second wafer 103 has a boundary portion 128 and a second wafer interface region 130. A layer of SiO2 is formed in the second wafer interface region 130 by exposing the second wafer interface region 130 to 02.

Figure 2:
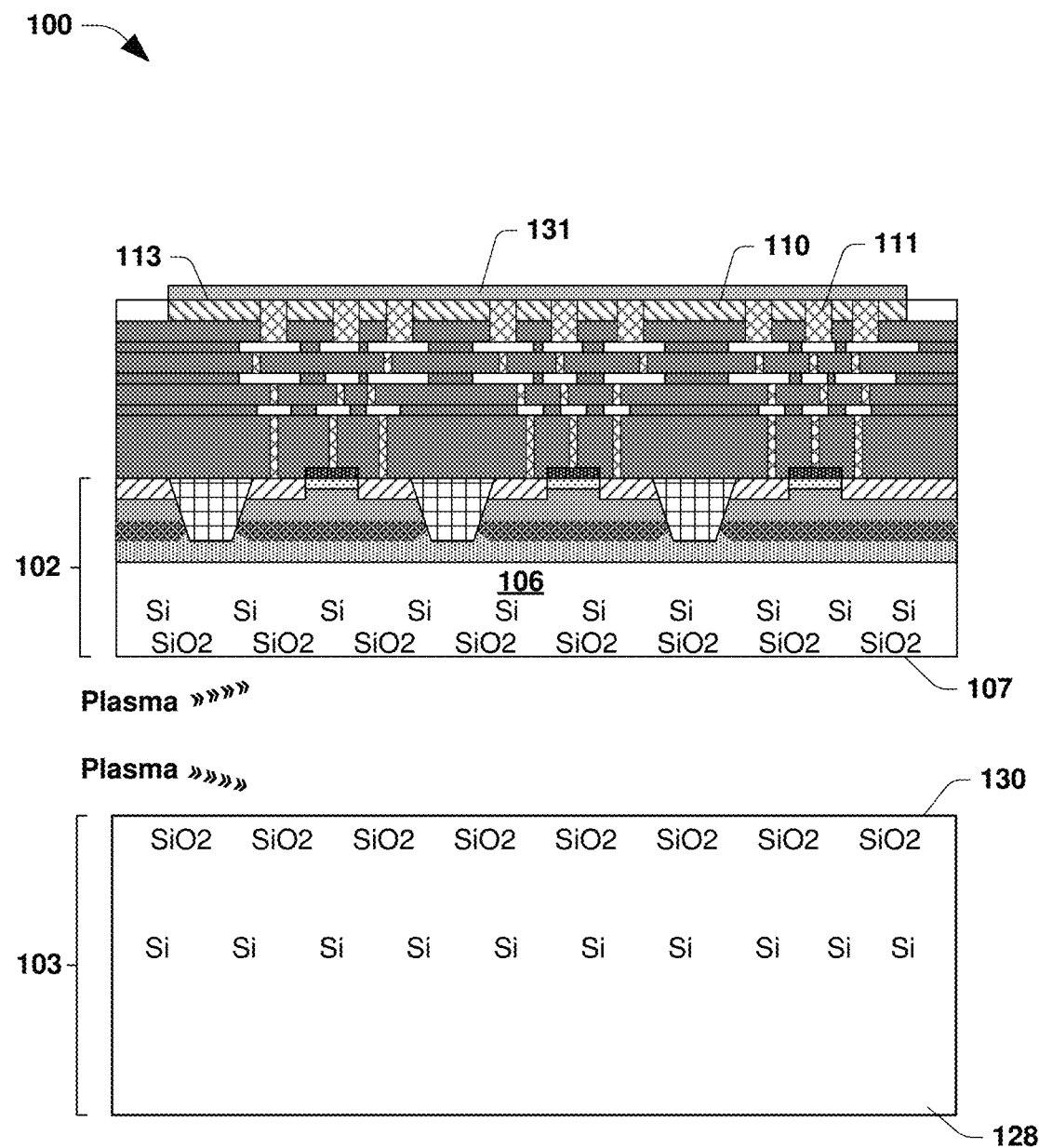

Referring to FIG. 2, a process for bonding the second wafer 103 to the first wafer 102 includes forming an oxide protect layer 131 over a top surface 113 of the passivation layer 110 and the interface VIAs 111. The oxide protect layer 131 is formed to protect the passivation layer 110 and the interface VIAs 111 against a bonding force/pressure applied to the first wafer 102 to bond the second wafer 103 to the first wafer 102, as described below with reference to FIG. 7.

In accordance with some embodiments, the oxide protect layer 131 is conformally formed over and across the passivation layer 110 and the interface VIAs 111. In some embodiments, the oxide protect layer 131 comprises at least one of SiO2, Si3N4, silicon oxynitride (SiON), dielectric material(s) with a high dielectric constant (high-k), or other suitable materials. The oxide protect layer 131 may be formed by at least one of CVD, PVD, ALD, high-density plasma CVD (HDPCVD), metal organic CVD (MOCVD), plasma enhanced CVD (PECVD), or other suitable techniques. In some embodiments, the oxide protect layer 131 has a thickness of between 0.5 nanometer (nm) and 3 nm. If the oxide protect layer 131 is too thick, such as greater than 3 nm, it may be difficult to remove in a following process. If the oxide protect layer 131 is too thin, such as less than 0.5 nm, the underlying structure may be damaged when bonding the second wafer 103 to the first wafer 102.

FIG. 2 illustrates the first wafer 102 and the second wafer 103 undergoing a plasma treatment. In some embodiments, the first wafer 102 is treated with plasma in a first plasma chamber (not shown) and the second wafer 103 is treated with plasma in a second plasma chamber (not shown). In some embodiments, the first wafer 102 and the second wafer 103 are each treated with plasma in the same plasma chamber (not shown). Plasma treatment includes injecting a material into the first plasma chamber, the second plasma chamber, or the same plasma chamber and applying a voltage to the injected material to generate plasma from the injected material. The injected material may be argon (Ar) or other suitable materials, and the plasma may be Ar plasma or other suitable plasma.

Figure 3:
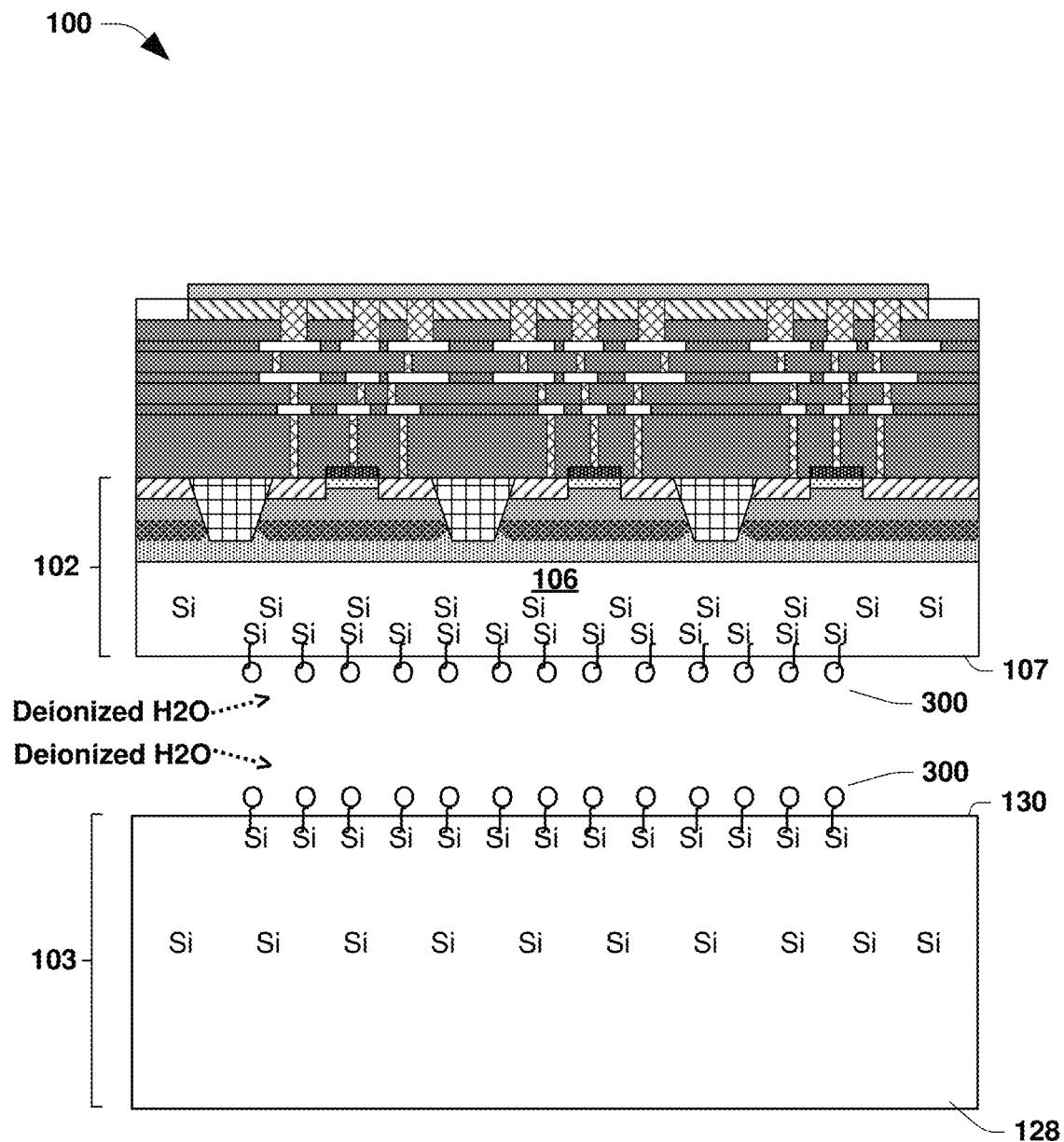

Referring to FIG. 3, it is shown that the plasma treatment activates the first wafer interface region 107 and the second wafer interface region 130. Activation includes changing the lattice structure of the SiO2 molecules at the first wafer interface region 107 and the second wafer interface region 130 by breaking the bonds between the Si atom and each of the O atoms. Breaking the bonds between the Si atom and each of the O atoms creates dangling Si—O bonds 300 at the first wafer interface region 107 and the second wafer interface region 130. The dangling Si—O bonds 300 replace and are weaker than the previously existing Si-02 bonds. The first wafer interface region 107 and the second wafer interface region 130 are each treated to form layers of molecular ions in the first wafer interface region 107 and the second wafer interface region 130. In some embodiments, the first wafer interface region 107 and the second wafer interface region 130 are each treated to form hydroxide ions (OH) from the dangling S—O bonds 300.

FIG. 3 illustrates a process of treating the first wafer interface region 107 and the second wafer interface region 130 by applying deionized water (H2O) molecules to the first wafer interface region 107 and the second wafer interface region 130 to form the OH ions from the dangling S—O bonds 300. The deionized H2O molecules cleanse the first wafer interface region 107 and the second wafer interface region 130 by separating the dangling O atoms from the Si atoms according to the following formula:

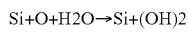

Si+O+H2O→Si+(OH)2     Formula 1

Figure 4:
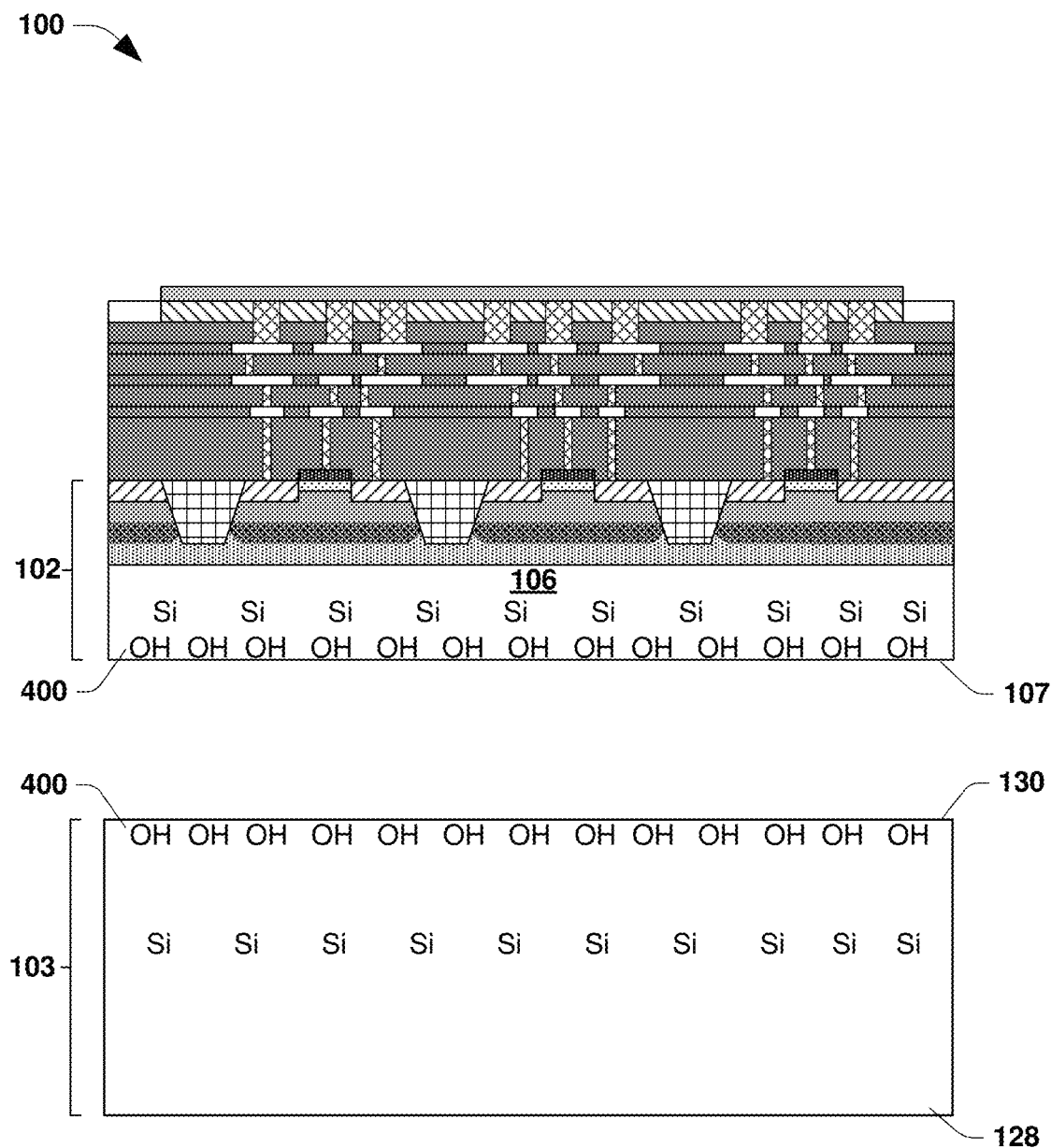

As illustrated in FIG. 4, the treatment with deionized water forms a first layer of OH 400 in the first wafer interface region 107 and a second layer of OH in the second wafer interface region 130. The first wafer interface region 107 and the second wafer interface region 130 may each be treated with deionized H2O in the same chamber or in different chambers.

Figure 5:
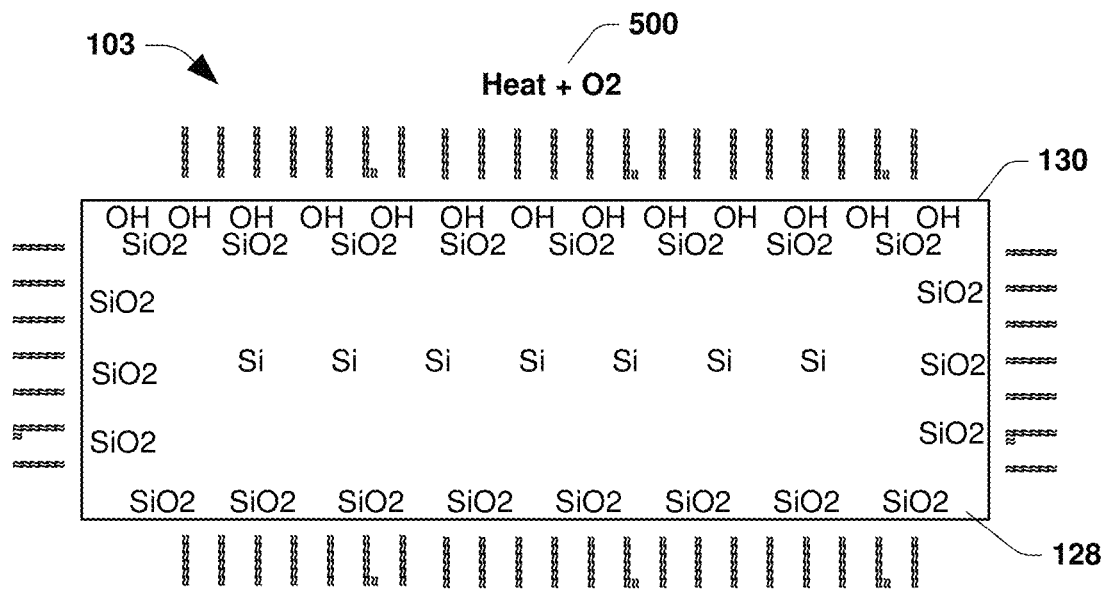
Figure 6:
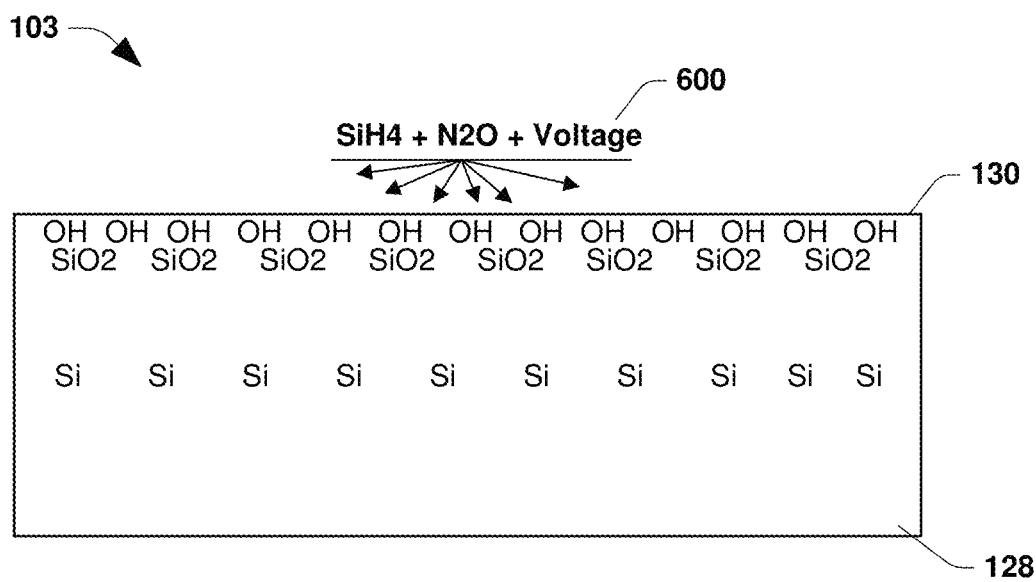

FIG. 5 and FIG. 6 illustrate two different processes for forming an oxide layer in at least some of the boundary portion 128 of the second wafer 103. FIG. 5 illustrates the formation of an oxide layer (SiO2) in the entire boundary portion 128. FIG. 6 illustrates the formation of an oxide layer primarily in the boundary portion 128 adjacent to the second wafer interface region 130. Formation of the oxide layer in the boundary portion 128 of the second wafer 103 may occur by way of either one of the process illustrated in FIG. 5 or the process illustrated in FIG. 6.

FIG. 5 illustrates a thermal process 500 (heat treatment) for forming a thermal oxide layer in the boundary portion 128 of the second wafer 103. The thermal oxide layer is formed inside of a heated chamber, a furnace, or other suitable temperature-controlled environment. A thermal oxide layer having a depth of 1000 angstroms (A) is formed by subjecting the second wafer 103 to an environment of oxygen (O2) and a temperature of 1000° Celsius for one hour. According to some embodiments, the thermal oxide layer is SiO2 and is formed by a molecular reaction between the Si of the second wafer 103 and the O2 to which the second wafer 103 is subjected:

Si+O2+heat→SiO2     Formula 2

At 1000 Å thick, the thermal oxide layer of the second wafer 103 reacts well with the first wafer interface region 107 to form covalent bonds between the first wafer 102 and the second wafer 103 during a subsequent anneal process discussed below with reference to FIG. 10.

FIG. 6 illustrates a plasma treatment 600 for forming an oxide layer in the boundary portion 128 of the second wafer 103 by application of a plasma directed to the second wafer interface region 130. In contrast to the thermal process 500 in which a thermal oxide layer is formed around the entire boundary portion 128 of the second wafer 103, by way of the plasma treatment 600 an oxide layer of SiO2 is formed primarily in the boundary portion 128 adjacent to the second wafer interface region 130.

The plasma treatment 600 includes subjecting the second wafer 103 to a high-density plasma (HDP) environment in a chamber. The plasma treatment 600 includes subjecting the second wafer 103 to an environment of silane (SiH4) and nitrous oxide (N2O), and applying a bias voltage directed at the second wafer interface region 130:

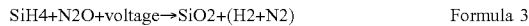

SiH4+N2O+voltage→SiO2+(H2+N2)        Formula 3

An oxide layer of SiO2 having a depth of 1000 angstroms (Å) is formed by subjecting the second wafer 103 to an environment of SiH4 and N2O at a temperature of 300° Celsius for one hour and directing the voltage toward the second wafer interface region. At 1000 Å thick, the oxide layer of the second wafer 103 formed by way of the plasma treatment 600 reacts well with the first wafer interface region 107 to form covalent bonds between the first wafer 102 and the second wafer 103 during a subsequent anneal process discussed below with reference to FIG. 10.

Figure 7:
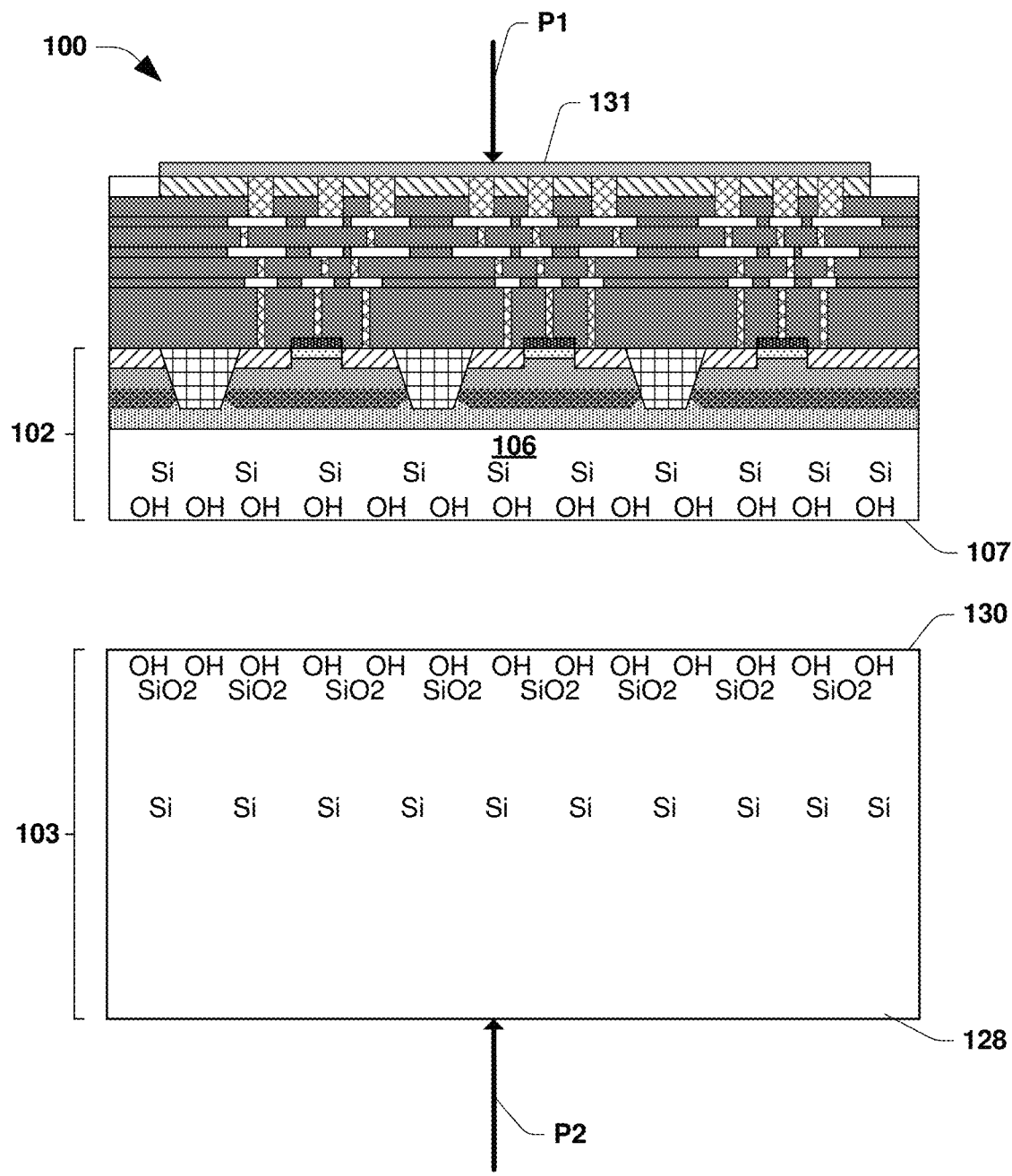
Figure 8:
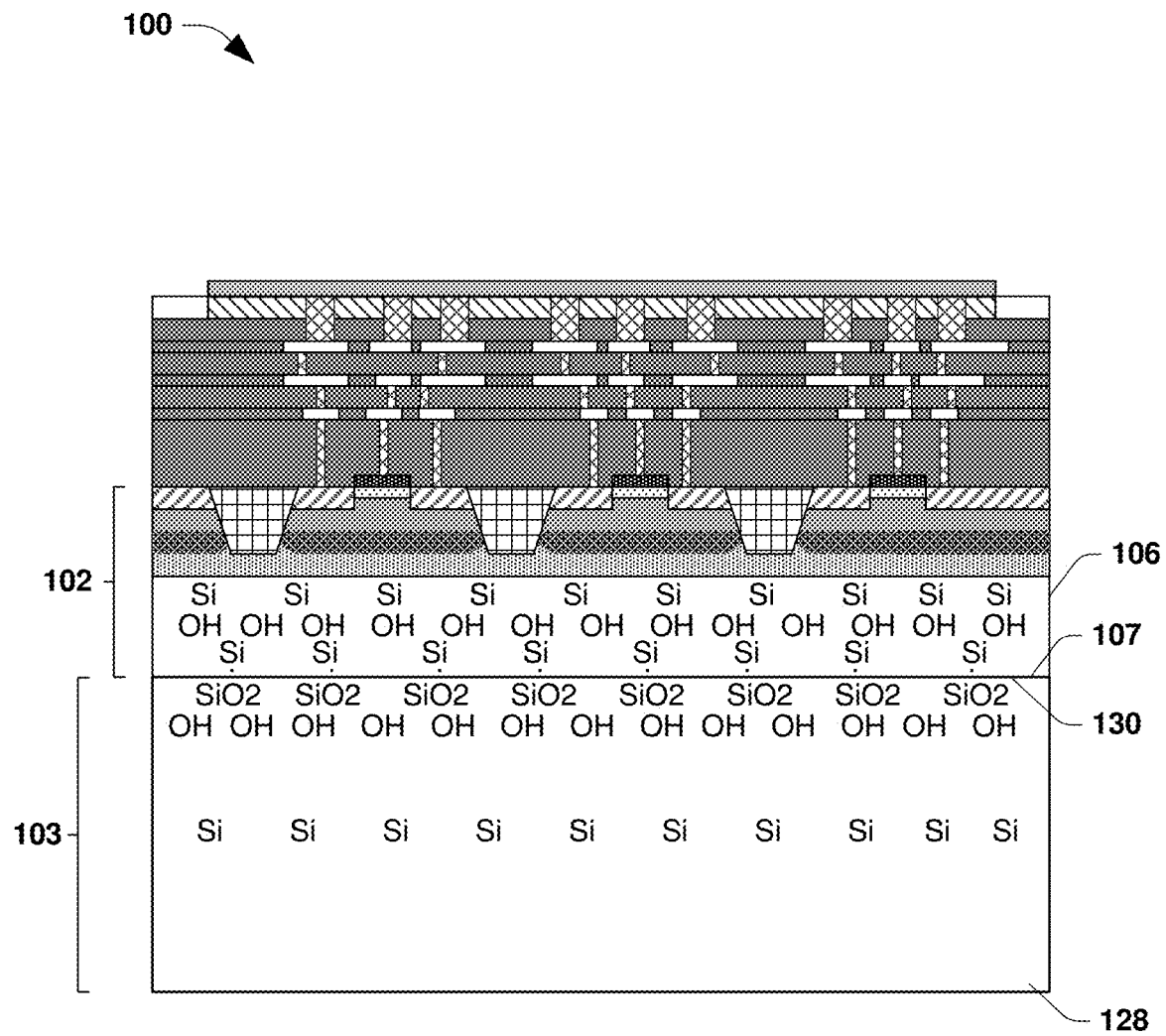

Referring to FIG. 7, regardless of whether the SiO2 oxide layer is formed by the thermal process 500 or the plasma treatment 600, the first wafer interface region 107 and the second wafer interface region 130 are aligned, such as to overlap or be vertically coincident with one another, and pressed together by applying at least one of a first pressure P1 to the oxide protect layer 131 in a direction toward the second wafer interface region 130 or a second pressure P2 to the boundary portion 128 in a direction toward the first wafer interface region 107. Due to the force of at least one of the first pressure P1 or the second pressure P2, the SiO2 molecules at the second wafer interface region 130 combine with the Si atoms at the first wafer interface region 107 by way of Van der Waals interaction to form an Si—SiO2 surface bond. As illustrated in FIG. 8, the Si—SiO2 surface bond bonds the first wafer 102 to the second wafer 103.

Figure 9:
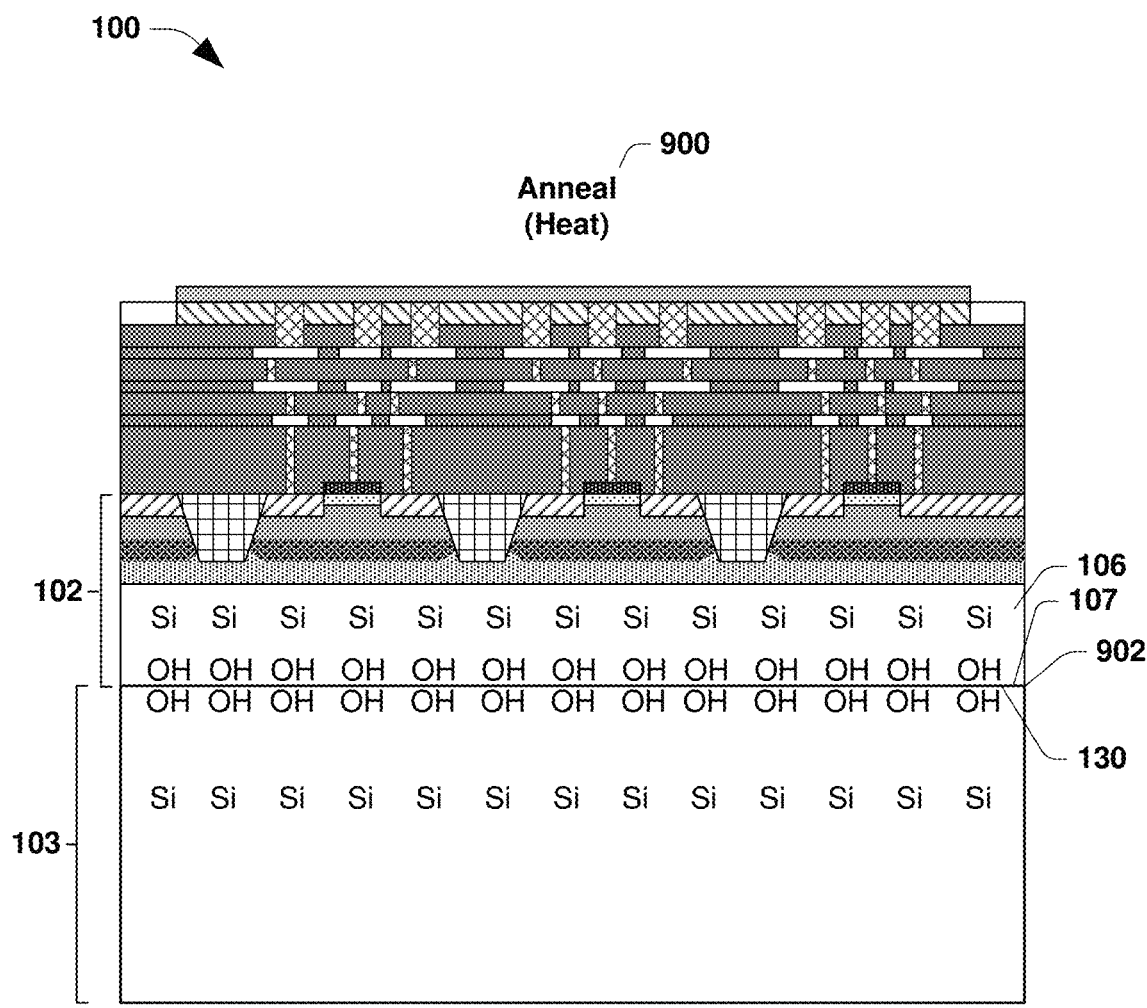
Figure 10:
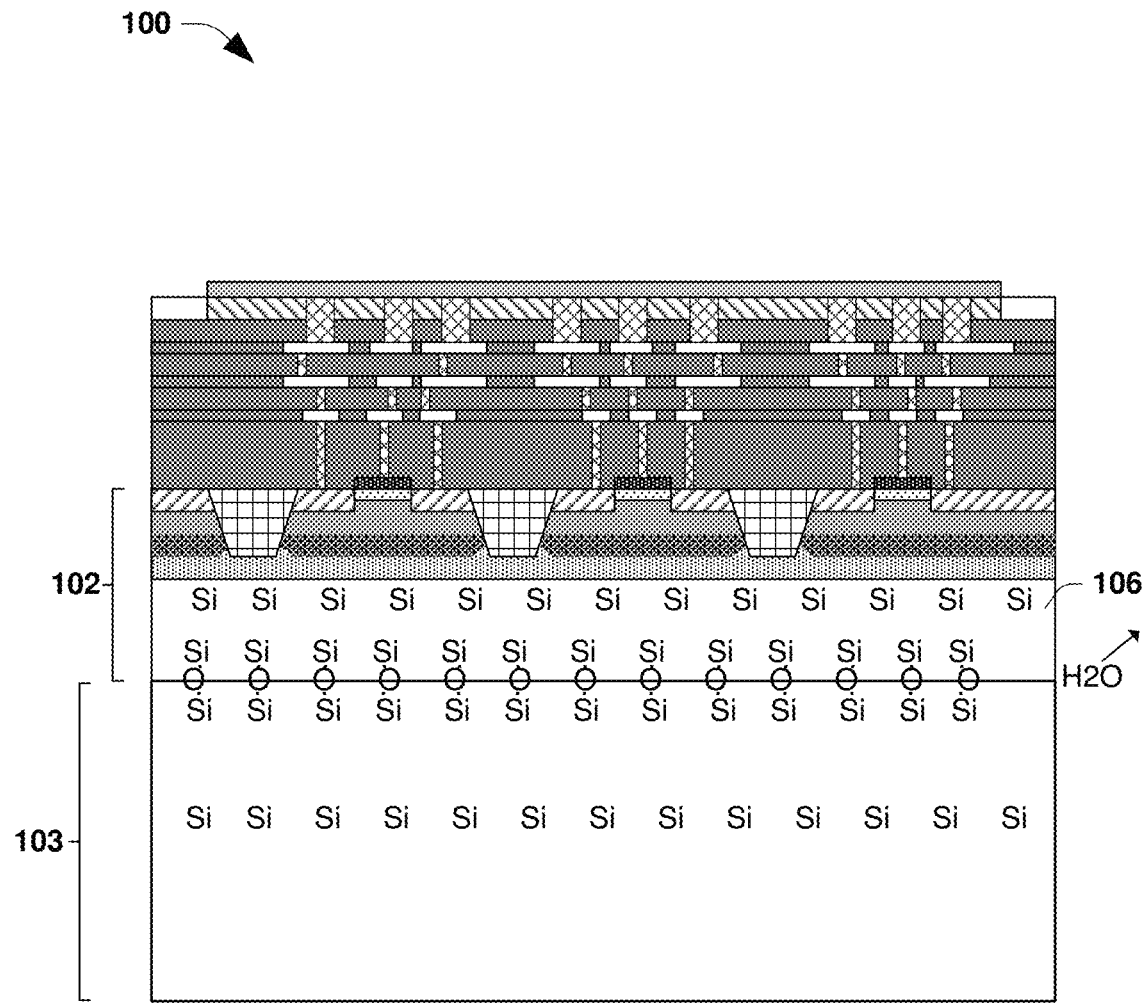

Referring to FIGS. 9 and 10, the Si—SiO2 surface bond between the first wafer 102 and the second wafer 103 is not illustrated for clarity of presentation. FIGS. 9 and 10 illustrate an anneal process 900 for forming covalent bonds of Si—O—Si at the interface 902 of the first wafer interface region 107 and the second wafer interface region 130. In some embodiments, the anneal process 900 includes subjecting the interface 902 of the first wafer interface region 107 and the second wafer interface region 130 to 350° Celsius for three hours. As the Si—O—Si covalent bonds form at the interface 902 of the first wafer interface region 107 and the second wafer interface region 130, the H atoms combine with O atoms to form H2O as a byproduct. Other temperatures and/or anneal times for forming the Si—O—Si covalent bonds between the first wafer 102 and the second wafer 103 are within the scope of the disclosure.

Figure 11:
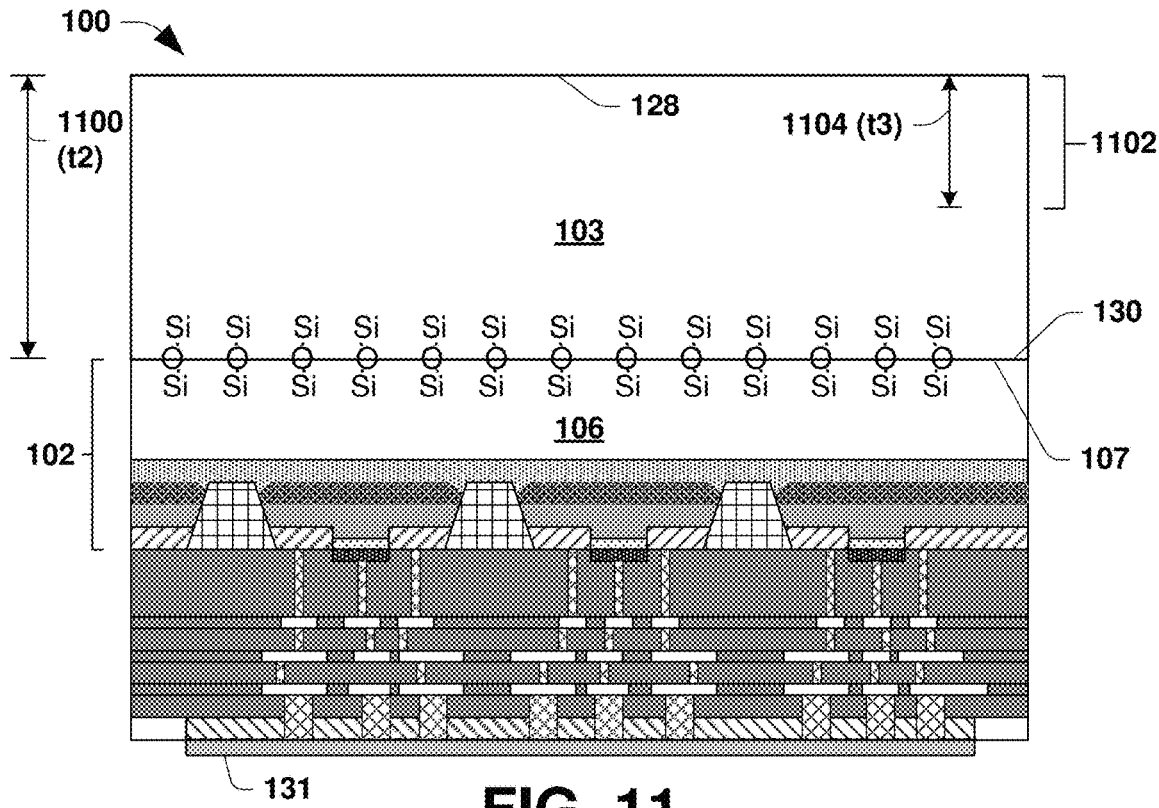
Figure 12:
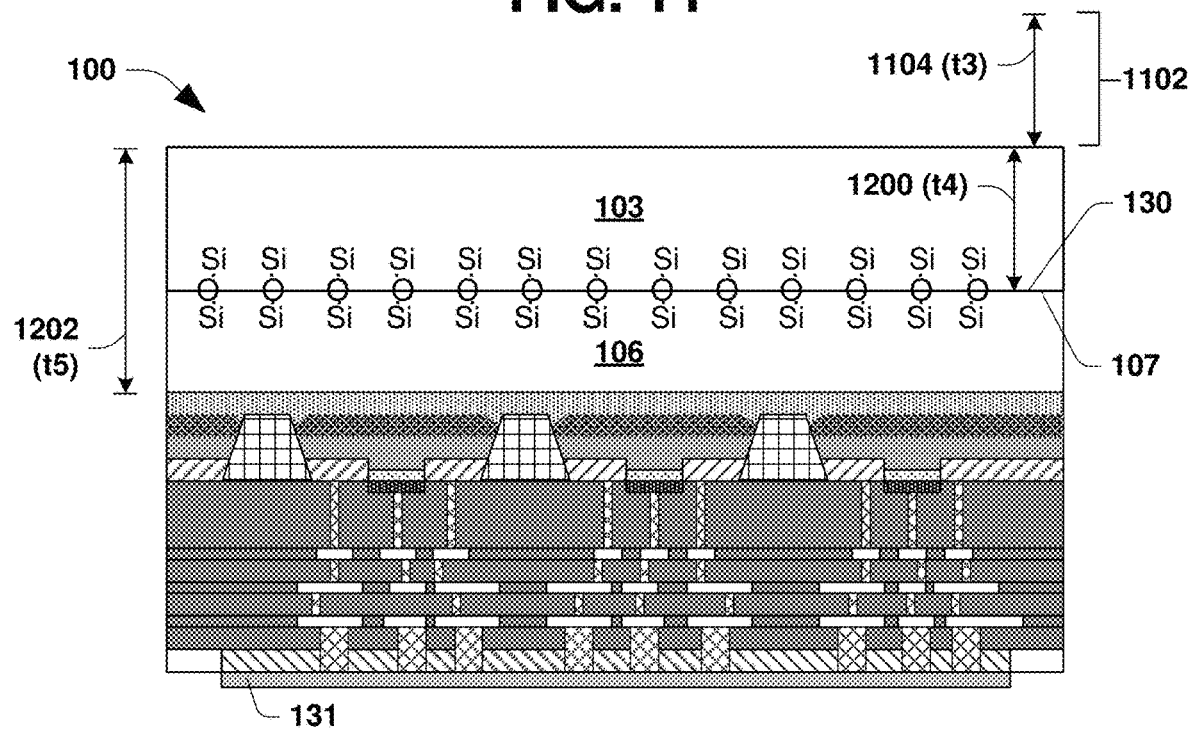

Referring to FIGS. 11 and 12 wherein the semiconductor arrangement 100 has been inverted, the thickness "t2" 1100 of the second wafer 103 is reduced by removing a base portion 1102 of the second wafer 103. According to some embodiments, the semiconductor arrangement 100 is rotated 180° or inverted to facilitate removal of the base portion 1102. The base portion 1102 is removed by at least one of wafer back-grinding, liquid etching, dry etching, plasma etching, chemical-mechanical polishing, planarization, or other suitable techniques. The base portion 1102 has a thickness of "t3" 1104. Other processes for removing the base portion 1102 are within the scope of the present disclosure.

Removing the base portion 1102 of the second wafer 103 reduces the thickness of the second wafer 103 from "t2" 1100 to "t4" 1200, thereby reducing a combined thickness "t5" 1202 of the first wafer 102 and the second wafer 103. According to some embodiments, the combined thickness "t5" 1202 of the first wafer 102 and the second wafer 103 after removing the base portion 1102 of the second wafer 103 is between 775 micrometers (μm) and 1,300 μm. A combined thickness "t5" 1202 that is between 775 μm and 1,300 μm reduces the weight of the semiconductor arrangement 100 yet enhances structural integrity due to the addition of the second wafer 103. As explained below, enhancing the structural integrity of the semiconductor arrangement 100 reduces the degree of warpage of the first wafer 102, thereby reducing or eliminating semiconductor arrangement 100 performance constraints that would otherwise result from an undesired degree of warpage of the first wafer 102.

It has been shown that a thickness "t1" 101 of the first wafer 102 of 775 μm results in 1,306 μm of warpage of the first wafer 102, and a combined thickness "t5" 1202 of the first wafer 102 and the second wafer 103 of 950 μm results in 1,086 μm of warpage of the first wafer 102. A combined thickness "t5" 1202 of 950 μm advantageously reduces warpage of the first wafer 102 by 17% relative to a thickness of 775 μm. Moreover, a combined thickness "t5" 1202 of the first wafer 102 and the second wafer 103 that is less than 1,300 μm does not unduly increase the weight of the semiconductor arrangement 100.

It has been shown that a thickness "t1" 101 of the first wafer 102 of 775 μm results in 185 μm of warpage of the first wafer 102, and a combined thickness "t5" 1202 of the first wafer 102 and the second wafer 103 of 958 μm results in 160 μm of warpage of the first wafer 102. A combined thickness "t5" 1202 of 958 μm advantageously reduces warpage of the first wafer 102 by 23% relative to a thickness of 775 μm. Other combined thicknesses of the first wafer 102 and the second wafer 103 are within the scope of the present disclosure.

According to some embodiments, the combined thickness "t5" 1202 is determined in accord with the Stoney Equation. The Stoney Equation determines the stress (σ) imposed on films formed over a wafer, such as films and layers of the layered foundation discussed with reference to FIG. 14. The Stoney Equation is:

$$\sigma = (E/(6 \cdot (1-\gamma))) \cdot (t_s/t_f) \cdot (1/R_\sigma)$$

Wherein E is Young's Modulus, γ is Poisson's Ratio, $t_s$ is the wafer thickness, $t_f$ is the thickness of a film or layer formed over a wafer, and $R_\sigma$ is a radius of curvature of the wafer. In accord with the Stoney Equation, the radius of curvature of the film(s) or layer(s) formed over a wafer increases as wafer thickness is increased. Thus, increasing the thickness of the wafer provides a larger radius of curvature and less stress on the films or layers formed over a wafer.

Figure 13:
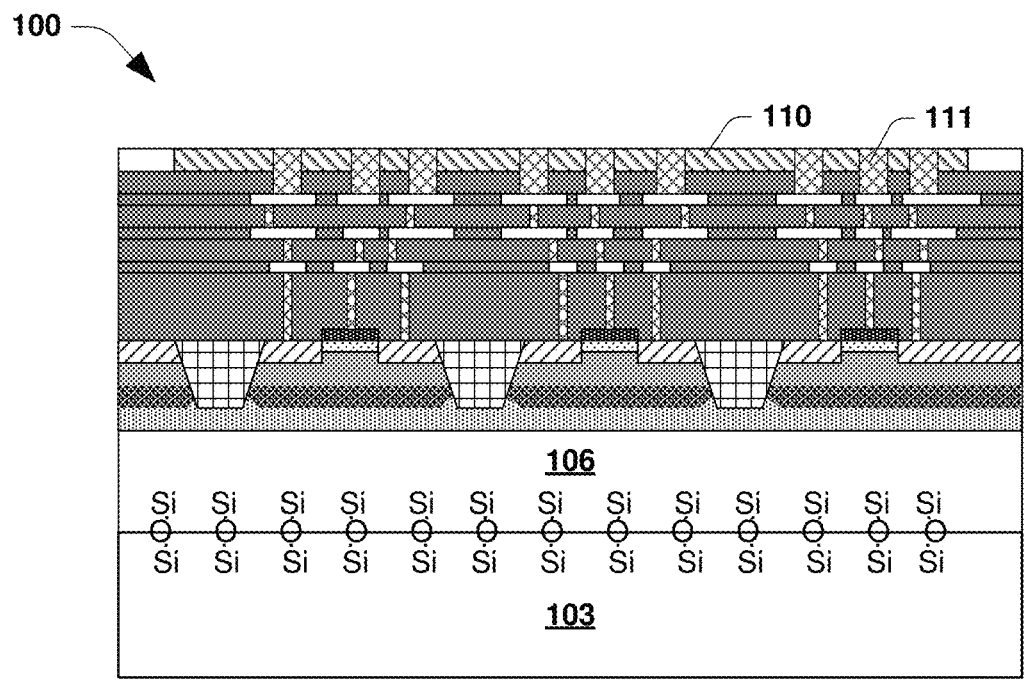

Referring to FIG. 13, after removing the base portion 1102 of the second wafer 103 the semiconductor arrangement 100 is (again) rotated 180° or inverted and the oxide protect layer 131 is removed. The oxide protect layer 131 is removed by at least one of liquid etching, dry etching, plasma etching, chemical-mechanical polishing, planarization, or other suitable techniques.

Figure 14:
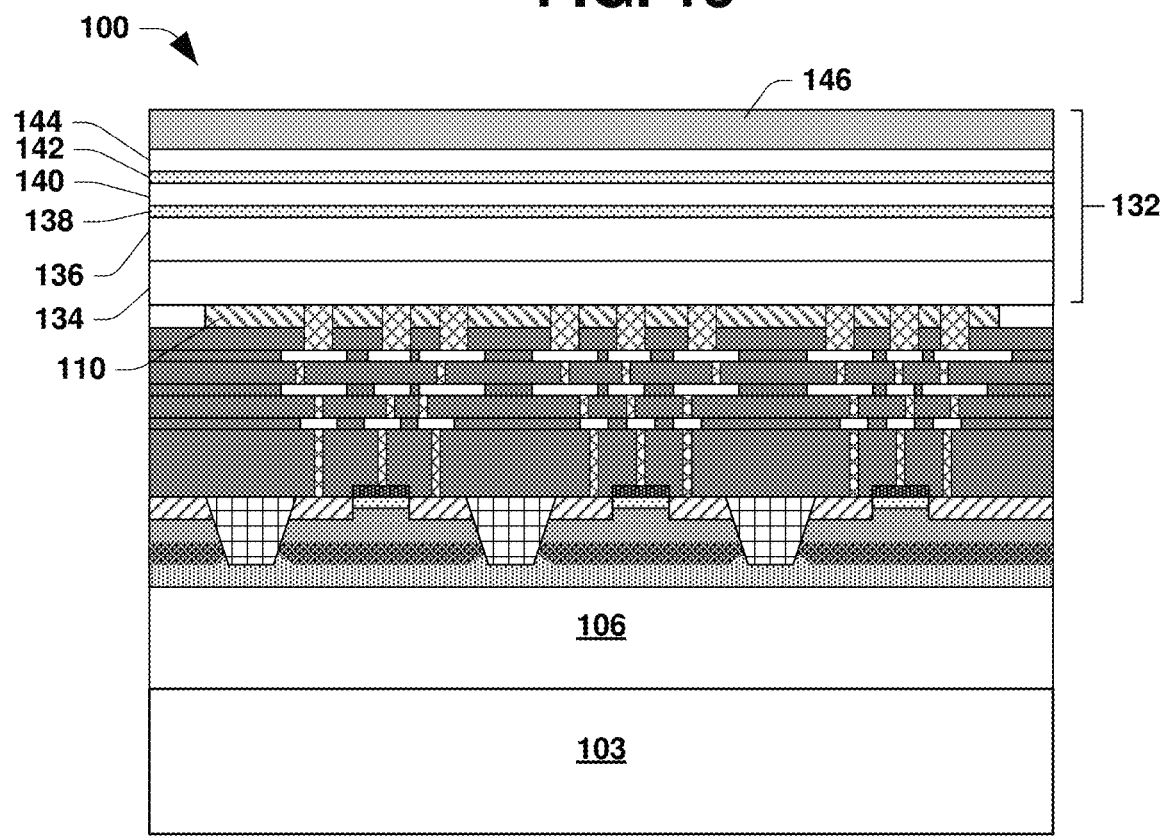

Referring to FIG. 14, a layered foundation 132 is formed over the passivation layer 110. In some embodiments, the layered foundation 132 comprises at least one of a silicon layer 134 over the passivation layer 110, a glue layer 136 over the silicon layer 134, a first insulation layer 138 over the glue layer 136, a first passivation layer 140 over the first insulation layer 138, a second insulation layer 142 over the first passivation layer 140, a second passivation layer 144 over the second insulation layer 142, or a polyimide layer 146 over the second passivation layer 144. Other configurations and/or compositions of the layered foundation 132 are within the scope of the present disclosure.

Each layer of the layered foundation 132 is formed by at least one of PVD, sputtering, CVD, LPCVD, ALCVD, UHVCVD, RPCVD, ALD, MBE, LPE, spin coating, oxidation, a passivation process, or other suitable techniques. Other techniques for forming each layer of the layered foundation 132 are within the scope of the present disclosure.

Figure 15:
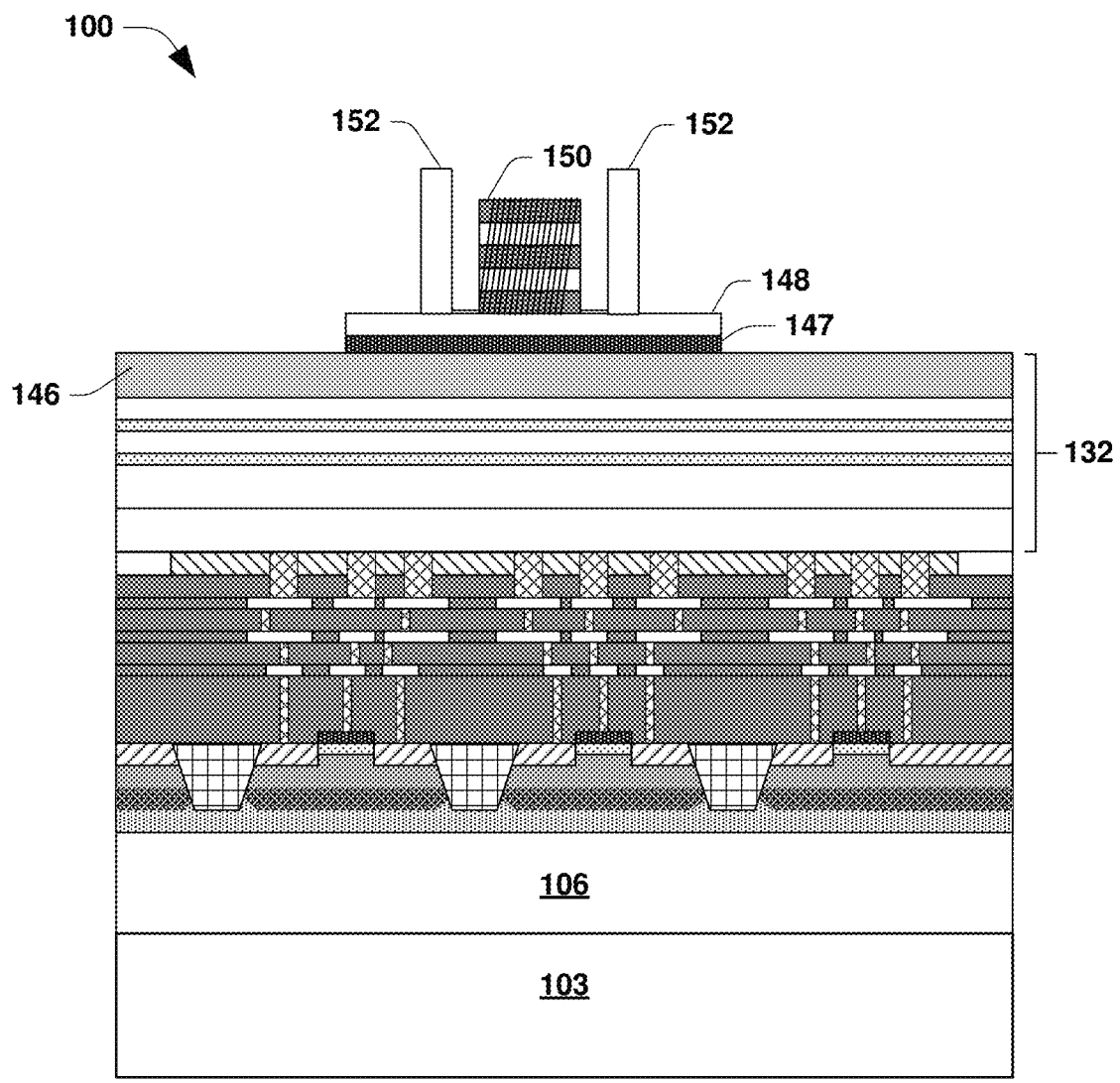

Referring to FIG. 15, the semiconductor arrangement 100 comprises an etch stop layer 147 over the layered foundation 132. The etch stop layer 147 is formed by at least one of PVD, sputtering, CVD, LPCVD, ALCVD, UHVCVD, RPCVD, MBE, LPE, or other suitable techniques. The etch stop layer 147 comprises at least one of silicon oxynitride (SiON), SiN, SiC, carbon doped silicon oxide, or other suitable materials. Other compositions and/or techniques for forming the etch stop layer 147 are within the scope of the present disclosure.

In some embodiments, the semiconductor arrangement 100 comprises a first magnetic material layer 148 over the etch stop layer 147. The composition of the first magnetic material layer 148 includes at least one of a metallic magnetic material or a soft ferrite magnetic material. A metallic magnetic material is at least one of Fe, oriented FeSi, unoriented FeSi, FeNi, FeCo, FeSiBNbCu, CoZrTa, or other suitable materials. A soft ferrite magnetic material is at least of MnZn, NiZn, $Fe_2O_3$, or other suitable materials. Other compositions of the first magnetic material layer 148 are within the scope of the present disclosure.

The semiconductor arrangement 100 comprises an electric component over the first magnetic material layer 148. In some embodiments, the semiconductor arrangement 100 comprises a lower noise amplifier, a voltage-controlled oscillator, an impedance matching circuit, or an integrated voltage regulator comprising an electric component 150, such as an on-chip inductor or a plurality of densely populated on-chip inductors, over the first magnetic material layer 148. The electric component 150 is electrically coupled to interconnects 152. According to some embodiments, the interconnects 152 are post passivation interconnects. Other electric components and/or interconnects are within the scope of the present disclosure.

In some semiconductor arrangements 100, the mass of the on-chip electric component 150, such as an on-chip inductor or a plurality of densely populated on-chip inductors, causes a device wafer, such as the first wafer 102, to warp an undesired degree. For example, in some embodiments the mass of an on-chip inductor or a plurality of densely populated on-chip inductors causes over 1,300 micrometers of warpage to the device wafer. Warpage of the device wafer may stress one or more films or layers formed over the device wafer an undesired degree. Such films or layers may include the films or layers of the layered foundation 132 discussed above with reference to FIG. 14. Depending of the degree of stress imposed on one or more of the one or more films or layers due to the mass of the electric component 150, the structure, composition, or function of one or more of the one or more films or layers may be adversely effected. An adverse effect may include the formation of undesirable thinned-out or "soft" areas of a film or layer. Thinned-out or "soft" areas of a film or layer may constrain or impair a functional purpose, such as constraining or impairing the adhesion function of the glue layer 136. Moreover, constraining or impairing the functional purpose of a film or layer may in turn constrain or impair the intended function or level of performance of the semiconductor arrangement 100.

As explained above, the addition of a carrier wafer, such as second wafer 103, bonded to the underside of the device wafer increases at least one of the rigidity or structural integrity of the semiconductor arrangement 100 and diminishes or eliminates warpage of the device wafer, thereby diminishing or eliminating the degree of stress imposed on one or more of the one or more films or layers. In some embodiments, the addition of a carrier wafer reduced wafer warpage from over 1,300 micrometers to under 1,100 micrometers.

Figure 16:
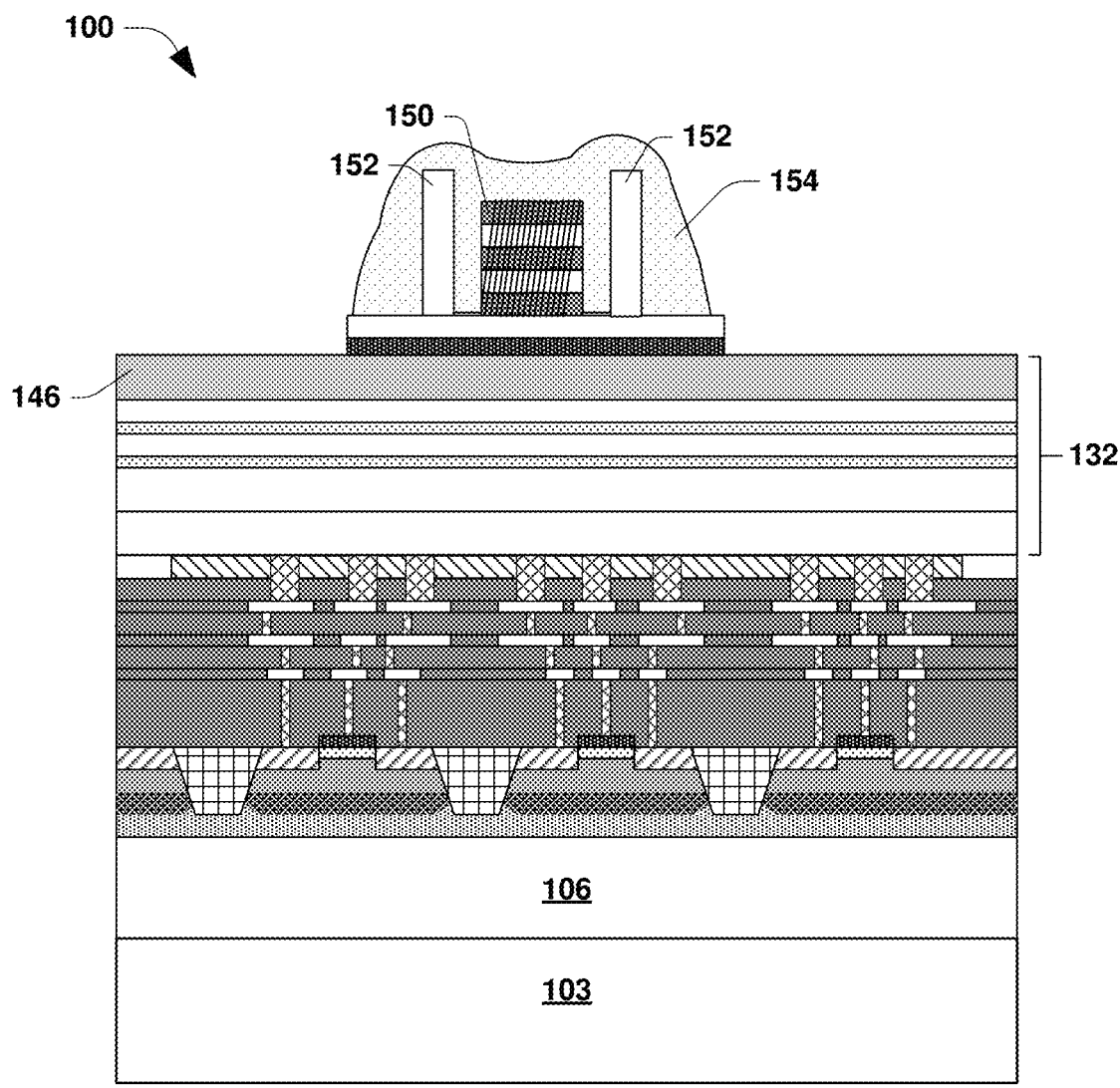

Referring to FIG. 16, the semiconductor arrangement 100 comprises a polyimide layer 154 over at least one of the electric component 150 or the interconnects 152. The polyimide layer 154 is formed by at least one of PVD, sputtering, CVD, LPCVD, ALCVD, UHVCVD, RPCVD, ALD, MBE, LPE, spin coating, oxidation, a passivation process, or other suitable techniques. The polyimide layer 154 increases the stability of at least one of the electric component 150 or the interconnects 152.

Figure 17:
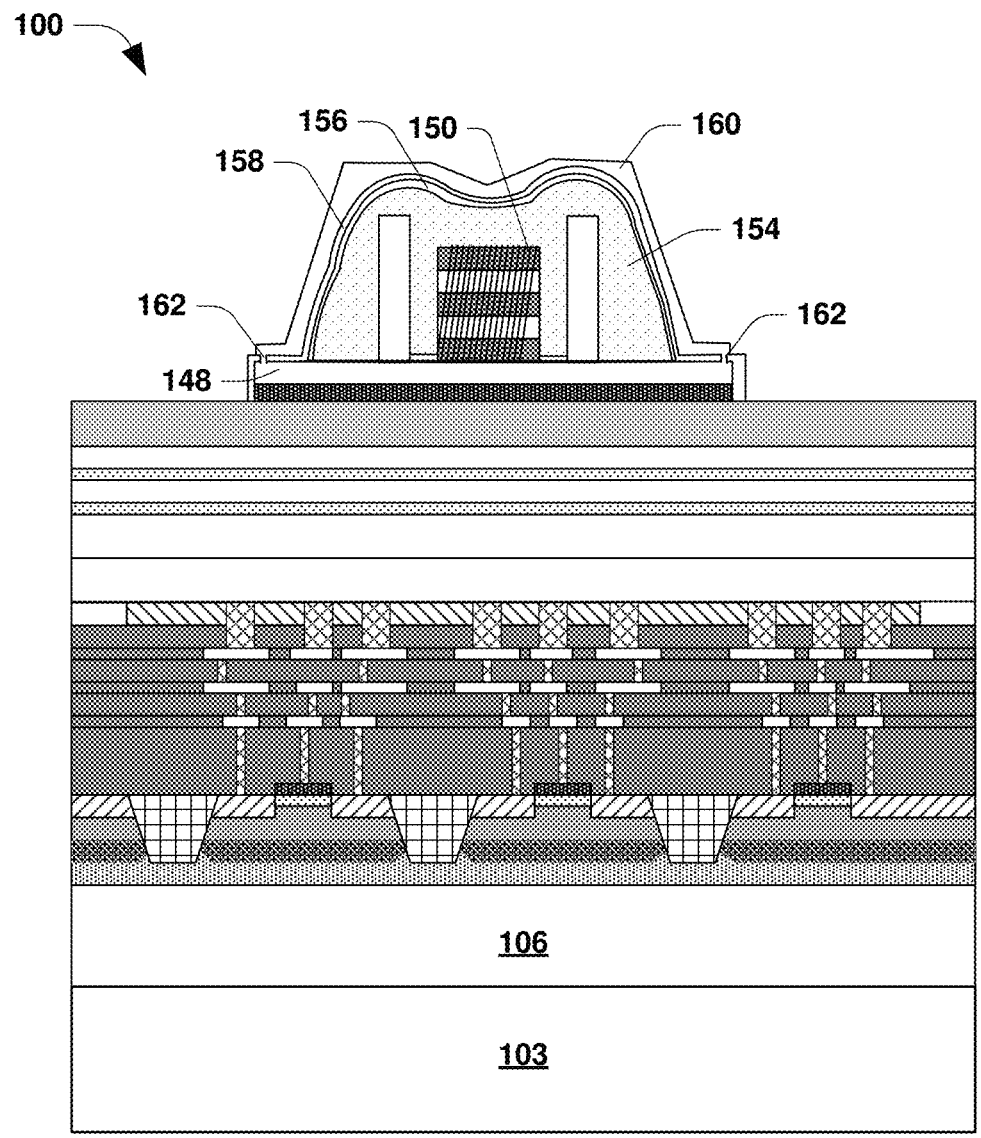

Referring to FIG. 17, the semiconductor arrangement 100 comprises a glue layer 156 over the polyimide layer 154 and an etch stop layer 158 over the glue layer 156. The glue layer 156 adheres the etch stop layer 158 to the polyimide layer 154.

At least one of the etch stop layer 158 or the glue layer 156 is formed by at least one of PVD, sputtering, CVD, LPCVD, ALCVD, UHVCVD, RPCVD, MBE, LPE, or other suitable techniques. The glue layer 156 comprises one or more of a polymer material, a silica material, an epoxy material, a phenolic material, an acrylic material a photoresist material, or other suitable materials. The etch stop layer 158 comprises at least one of silicon oxynitride (SiON), SiN, SiC, carbon doped silicon oxide, or other suitable materials. Other compositions and/or techniques for forming at least one of the glue layer 156 or the etch stop layer 158 are within the scope of the present disclosure.

The semiconductor arrangement 100 comprises a second magnetic material layer 160 over the etch stop layer 158. The composition of the second magnetic material layer 160 includes at least one of a metallic magnetic material or a soft ferrite magnetic material. A metallic magnetic material is at least one of Fe, oriented FeSi, unoriented FeSi, FeNi, FeCo, FeSiBNbCu, CoZrTa, or other suitable materials. A soft ferrite magnetic material is at least one of MnZn, NiZn, $Fe_2O_3$, or other suitable materials. Other compositions of the second magnetic material layer 160 are within the scope of the present disclosure.

The semiconductor arrangement 100 comprises magnetic VIAs 162 to couple the second magnetic material layer 160 to the first magnetic material layer 148. The magnetic VIAs 162 complete a path for magnetic flux. The magnetic flux significantly increases the inductance of the electric component 150. Other structures that increase the inductance of the electric component 150 are within the scope of the present disclosure.

Figure 18:
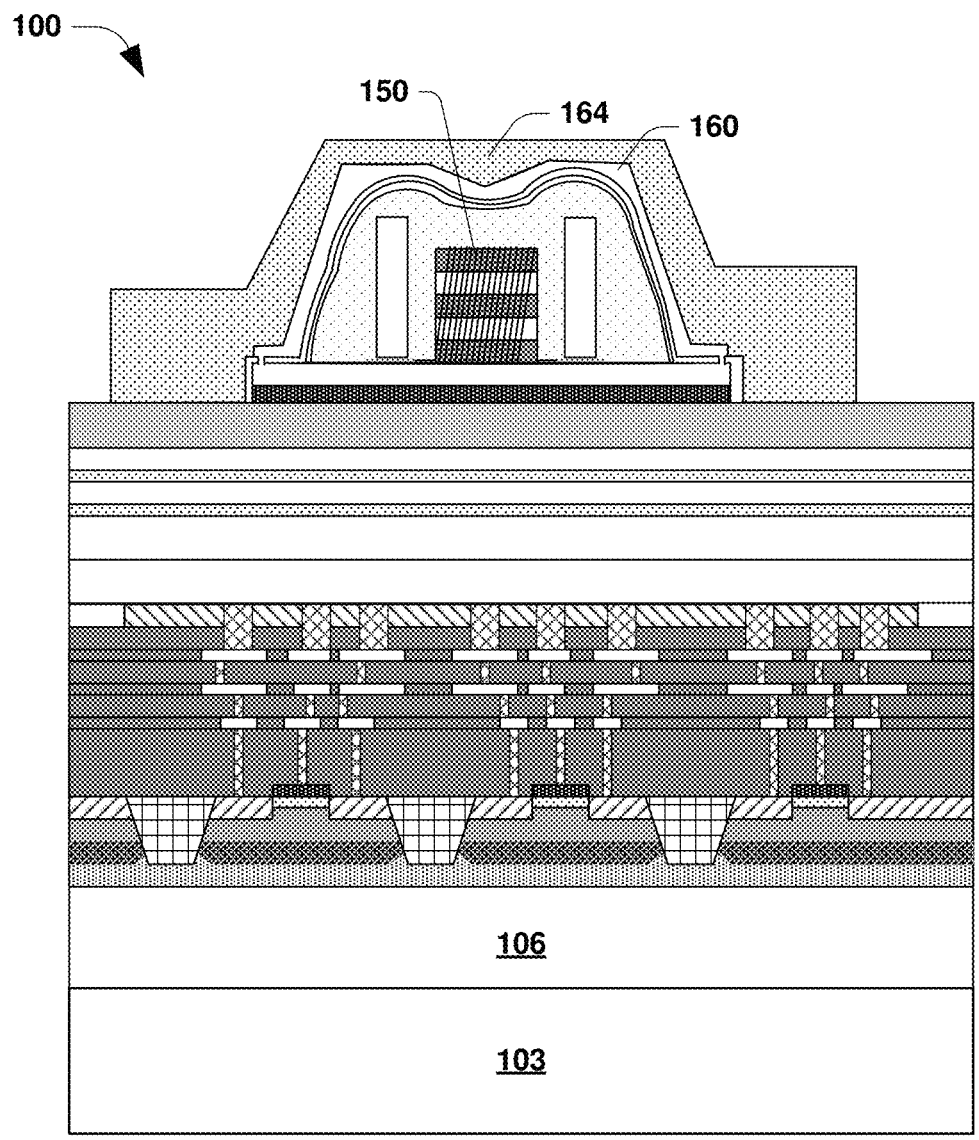

Referring to FIG. 18, the semiconductor arrangement 100 comprises a reinforcement structure 164 to reinforce and protect the electric component 150 from environmental conditions. The reinforcement structure 164 is at least one of over the electric component 150, directly over and completely blankets the electric component 150, indirectly over and completely blankets the electric component 150, directly over and partially blankets the electric component 150, or indirectly over and partially blankets the electric component 150.

The reinforcement structure 164 comprises at least one of a polymer layer, a polyimide layer, or other suitable materials. The reinforcement structure 164 is formed by at least one of PVD, sputtering, CVD, LPCVD, ALCVD, UHVCVD, RPCVD, ALD, MBE, LPE, spin coating, oxidation, a passivation process, or other suitable techniques. Other configurations and/or compositions of the reinforcement structure 164 are within the scope of the disclosure.

Figure 19:
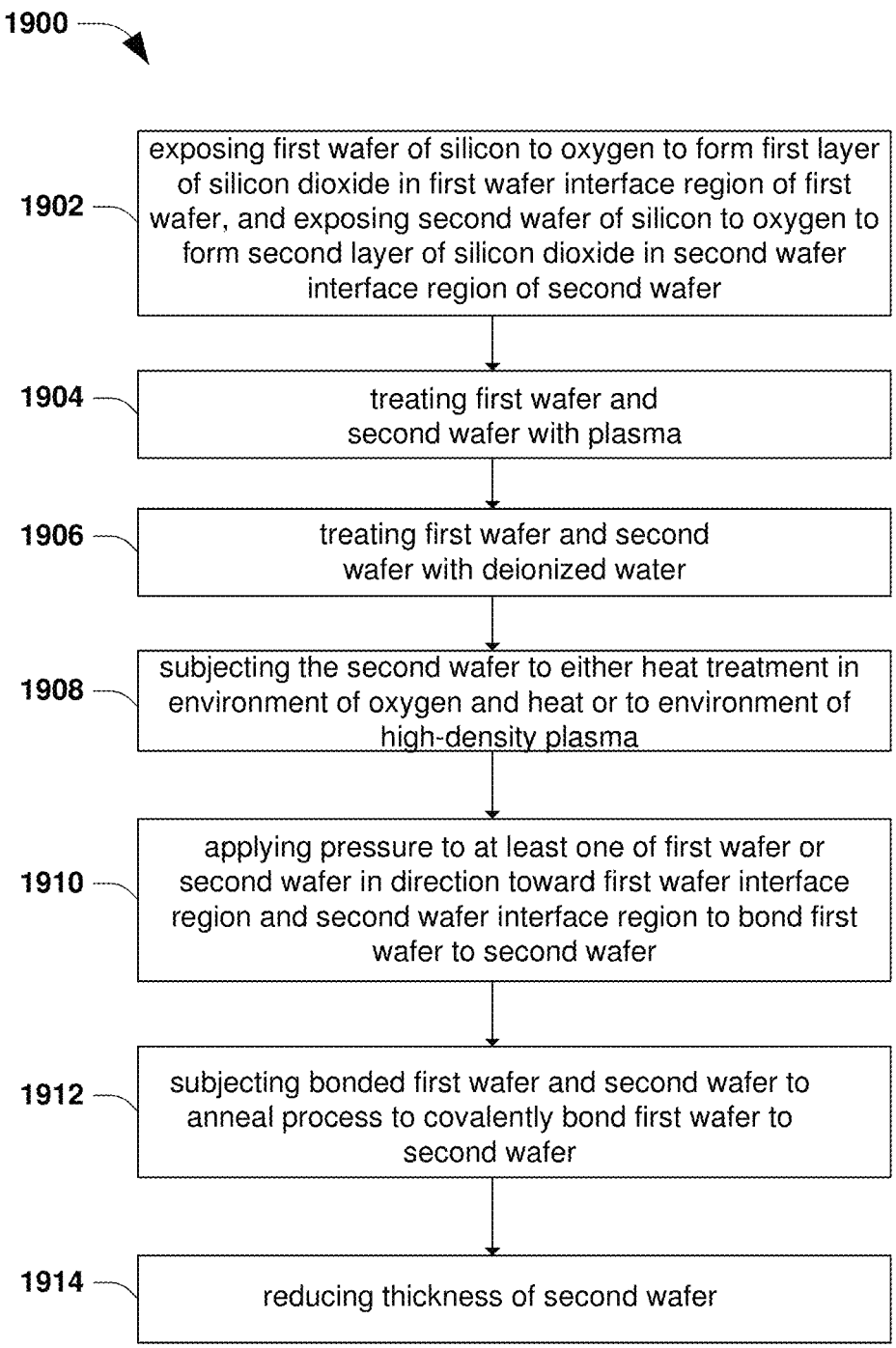
FIG. 19 is an illustration of a method of making a semiconductor arrangement, according to some embodiments.

FIG. 19 is an illustration of a method 1900 of making a semiconductor arrangement, according to some embodiments. At 1902, the method 1900 of making a semiconductor arrangement comprises exposing a first wafer of silicon to oxygen to form a first layer of silicon dioxide in a first wafer interface region of a first wafer, and exposing a second wafer of silicon to oxygen to form a second layer of silicon dioxide in a second wafer interface region of a second wafer. At 1904, the first wafer and the second wafer are treated with a plasma to form dangling Si—O bonds in the first wafer interface region and the second wafer interface region. At 1906, the method includes treating the first wafer interface region and the second wafer interface region with deionized water molecules to form hydroxide ions in the first wafer interface region and the second wafer interface region. At 1908, the second wafer is subjected to either a heat treatment in an environment of oxygen and heat or to a high-density plasma environment to form an oxide layer in the second wafer interface region. At 1910, the method includes applying pressure to at least one of the first wafer or the second wafer in a direction toward the first wafer interface region and the second wafer interface region to bond the first wafer to the second wafer. At 1912, the method includes subjecting the bonded first wafer and second wafer to an anneal process to covalently bond the first wafer to the second wafer. At 1914, the thickness of the semiconductor arrangement may be reduced by removing a portion of the second wafer from the semiconductor arrangement.

Figure 20:
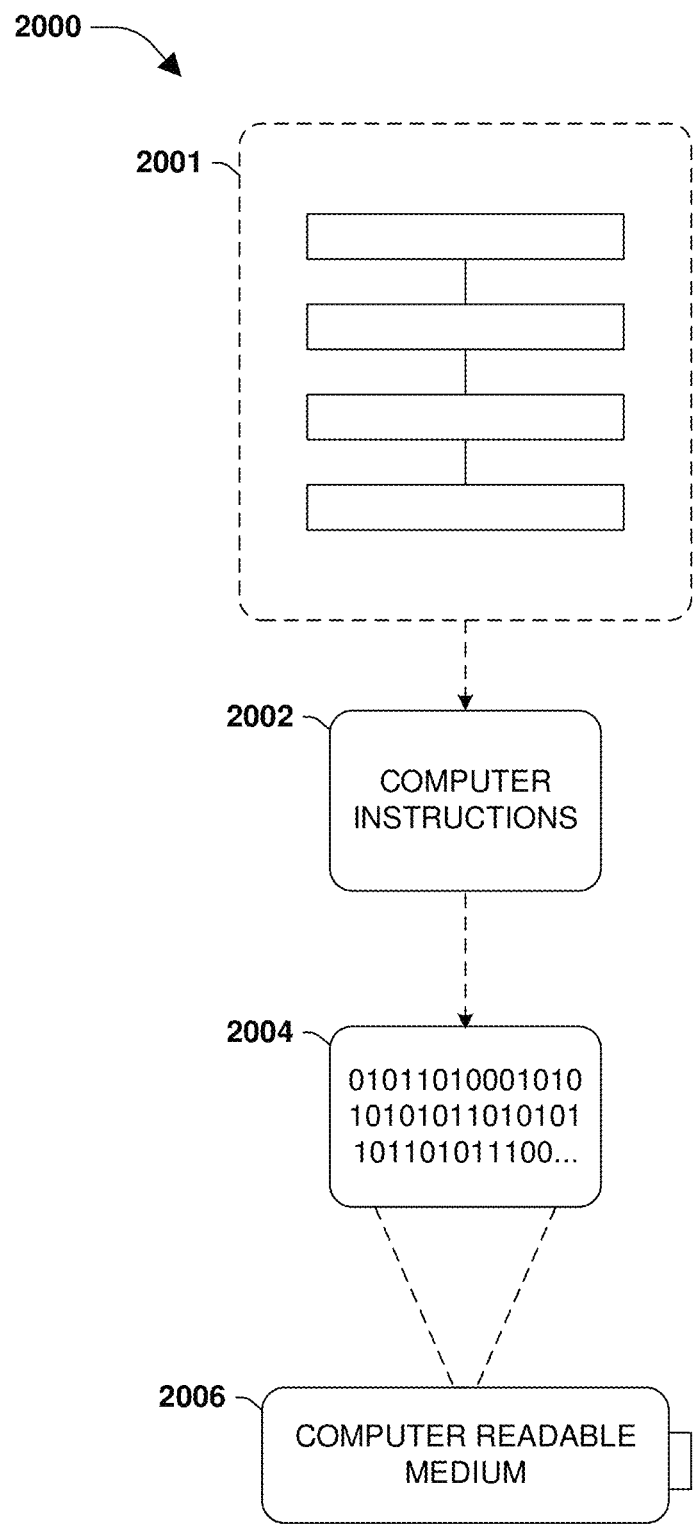
FIG. 20 illustrates an exemplary computer-readable medium, according to some embodiments.

FIG. 20 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 20, wherein the embodiment 2000 comprises a computer-readable medium 2006 (e.g., a CD-R, DVD-R, flash drive, a platter of a hard disk drive, etc.), on which is encoded computer-readable data 2004. This computer-readable data 2004 in turn comprises a set of processor-executable computer instructions 2002 that when executed are configured to facilitate operations according to one or more of the principles set forth herein. In some embodiments 2000, the processor-executable computer instructions 2002 are configured to facilitate performance of a method 2001, such as at least some of the aforementioned method(s). In some embodiments, the processor-executable computer instructions 2002 are configured to facilitate implementation of a system, such as at least some of the one or more aforementioned system(s). Many such computer-readable media may be devised by those of ordinary skill in the art that are configured to operate in accordance with the techniques presented herein.

As disclosed, resistance to warpage of a semiconductor arrangement is increased by covalently bonding a carrier wafer to a device wafer to increase rigidity or structural integrity of the semiconductor arrangement. The covalent bond is formed at an interface region of the carrier wafer and an interface region of the device wafer. A method for forming the covalent bond includes first forming a Van de Waals bond at the interface regions of the device wafer and the carrier wafer by application of pressure/force toward the interface regions. The bonded device wafer and carrier wafer are then subjected to an anneal process to form Si—O—Si covalent bonds at the interface regions. The thickness of the semiconductor arrangement is reduced by removing a base portion of the carrier wafer. Reducing the thickness of the carrier wafer reduces the weight of the semiconductor arrangement while maintaining a sufficient increase in rigidity of the semiconductor arrangement to inhibit warpage of the device wafer. The degree of warpage of the semiconductor arrangement due to heavy and/or densely populated electronic components in and/or on the device wafer is less than the degree of warpage of a semiconductor arrangement that does not include a carrier wafer bonded to a device wafer.

A method of making a semiconductor arrangement includes forming a first layer of molecular ions in a first wafer interface region of a first wafer, forming a second layer of molecular ions in a second wafer interface region of a second wafer, forming a first molecular bond connecting the first wafer interface region to the second wafer interface region by applying pressure to at least one of the first wafer or the second wafer in a direction toward the first wafer interface region and the second wafer interface region, and annealing the first wafer and the second wafer to form a second molecular bond connecting the first wafer interface region to the second wafer interface region.

A method of making a semiconductor arrangement includes plasma treating a first wafer interface region of a first wafer, plasma treating a second wafer interface region of a second wafer, treating the first wafer interface region with deionized water after plasma treating the first wafer interface region of the first wafer, treating the second wafer interface region with deionized water after plasma treating the second wafer interface region of the second wafer, forming a layer of silicon dioxide in the second wafer interface region after treating the second wafer interface region with the deionized water, aligning a first surface of the first wafer interface region with a second surface of the second wafer interface region, applying pressure to at least one of the first wafer or the second wafer in a direction toward the first wafer interface region and the second wafer interface region after aligning the first surface of the first wafer interface region with the second surface of the second wafer interface region, and annealing the first wafer and the second wafer to form a molecular bond connecting the first wafer interface region to the second wafer interface region.

A method of making a semiconductor arrangement includes forming a first layer of silicon-oxygen molecules at a first wafer interface region of a first wafer, forming a second layer of silicon-oxygen molecules at a second wafer interface region of a second wafer, treating the first layer of silicon-oxygen molecules and the second layer of silicon-oxygen molecules with deionized water molecules, aligning a first surface of the first wafer interface region with a second surface of the second wafer interface region, and annealing the first wafer and the second wafer to form covalent silicon-oxygen-silicon bonds at an interface of the first surface of the first wafer interface region and the second surface of the second wafer interface region to bond the first wafer to the second wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of making a semiconductor arrangement, the method comprising:
   forming a first layer of molecular ions in a first wafer interface region of a first wafer;
   forming a second layer of molecular ions in a second wafer interface region of a second wafer;
   forming a first molecular bond connecting the first wafer interface region to the second wafer interface region by applying pressure to at least one of the first wafer or the second wafer in a direction toward the first wafer interface region and the second wafer interface region, wherein the first wafer interface region has a different material composition than the second wafer interface region and is free of silicon dioxide at a start of applying the pressure; and
   annealing the first wafer and the second wafer to form a second molecular bond connecting the first wafer interface region to the second wafer interface region.

2. The method of claim 1, wherein:
   forming the first layer of molecular ions comprises forming a first layer of hydroxide in the first wafer interface region; and
   forming the second layer of molecular ions comprises forming a second layer of hydroxide in the second wafer interface region.

3. The method of claim 1, comprising:
   forming a first layer of silicon dioxide in the first wafer interface region by exposing the first wafer interface region to oxygen before forming the first layer of molecular ions; and
   forming a second layer of silicon dioxide in the second wafer interface region by exposing the second wafer interface region to oxygen before forming the second layer of molecular ions.

4. The method of claim 3, wherein:
   forming the first layer of molecular ions comprises treating the first wafer interface region with argon plasma after forming the first layer of silicon dioxide in the first wafer interface region; and
   forming the second layer of molecular ions comprises treating the second wafer interface region with argon plasma after forming the second layer of silicon dioxide in the second wafer interface region.

5. The method of claim 4, wherein:
forming the first layer of molecular ions comprises treating the first wafer interface region with deionized water after treating the first wafer interface region with argon plasma; and
forming the second layer of molecular ions comprises treating the second wafer interface region with deionized water after treating the second wafer interface region with argon plasma.

6. The method of claim 1, wherein the second molecular bond is a silicon-oxide-silicon covalent bond.

7. The method of claim 1, wherein forming the first molecular bond connecting the first wafer interface region to the second wafer interface region comprises forming a layer of silicon dioxide in the second wafer interface region before applying the pressure.

8. The method of claim 7, wherein forming the layer of silicon dioxide in the second wafer interface region comprises heat treating the second wafer to grow a thermal oxide layer in the second wafer interface region.

9. The method of claim 7, wherein forming the layer of silicon dioxide in the second wafer interface region comprises subjecting the second wafer interface region to a high-density plasma environment.

10. The method of claim 1, comprising reducing a thickness of the second wafer after annealing the first wafer and the second wafer.

11. A method of making a semiconductor arrangement, the method comprising:
plasma treating a first wafer interface region of a first wafer;
plasma treating a second wafer interface region of a second wafer;
treating the first wafer interface region with deionized water after plasma treating the first wafer interface region of the first wafer;
treating the second wafer interface region with deionized water after plasma treating the second wafer interface region of the second wafer;
forming a layer of silicon dioxide in the second wafer interface region after treating the second wafer interface region with the deionized water;
aligning a first surface of the first wafer interface region with a second surface of the second wafer interface region;
applying pressure to at least one of the first wafer or the second wafer in a direction toward the first wafer interface region and the second wafer interface region after aligning the first surface of the first wafer interface region with the second surface of the second wafer interface region, wherein the first wafer interface region is free of silicon dioxide at a start of applying the pressure; and
annealing the first wafer and the second wafer to form a molecular bond connecting the first wafer interface region to the second wafer interface region.

12. The method of claim 11, wherein forming the molecular bond connecting the first wafer interface region to the second wafer interface region comprises forming silicon-oxide-silicon molecules at an interface of the first wafer interface region and the second wafer interface region.

13. The method of claim 11, wherein forming the layer of silicon dioxide in the second wafer interface region comprises heat treating the second wafer to grow a thermal oxide layer in the second wafer interface region.

14. The method of claim 11, wherein forming the layer of silicon dioxide in the second wafer interface region comprises subjecting the second wafer interface region to a high-density plasma environment.

15. The method of claim 14, wherein the high-density plasma environment comprises silane plasma and nitrous oxide plasma.

16. The method of claim 11 comprising reducing a thickness of the second wafer.

17. A method of making a semiconductor arrangement, the method comprising:
forming a first layer of silicon-oxygen molecules at a first wafer interface region of a first wafer;
forming a second layer of silicon-oxygen molecules at a second wafer interface region of a second wafer;
treating the first layer of silicon-oxygen molecules and the second layer of silicon-oxygen molecules with deionized water molecules;
forming a layer of silicon dioxide in the second wafer interface region after treating the second layer of silicon-oxygen molecules with the deionized water molecules, wherein a layer of silicon dioxide is not formed in the first wafer interface region after treating the first layer of silicon-oxygen molecules;
aligning a first surface of the first wafer interface region with a second surface of the second wafer interface region; and
annealing the first wafer and the second wafer to form covalent silicon-oxygen-silicon bonds at an interface of the first surface of the first wafer interface region and the second surface of the second wafer interface region to bond the first wafer to the second wafer.

18. The method of claim 17, comprising:
applying pressure to at least one of the first wafer or the second wafer in a direction toward the first wafer interface region and the second wafer interface region after aligning the first surface of the first wafer interface region with the second surface of the second wafer interface region to bond the first wafer to the second wafer.

19. The method of claim 17, comprising forming doped regions in an implant region of the first wafer before forming the first layer of silicon-oxygen molecules at the first wafer interface region of the first wafer.

20. The method of claim 17, comprising:
coupling an electric component to an upper surface of the first wafer; and
reducing a combined thickness of the first wafer and the second wafer to a thickness within a thickness range of 775 micrometers to 1,300 micrometers after annealing the first wafer and the second wafer.

* * * * *